US012672442B2

(12) United States Patent
Deng et al.

(10) Patent No.: US 12,672,442 B2
(45) Date of Patent: Jun. 30, 2026

(54) DRIVING BACKPLANE AND METHOD FOR MANUFACTURING THE SAME, DISPLAY PANEL, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lei Deng, Beijing (CN); Yue Wei, Beijing (CN); Shiyang Xu, Beijing (CN); Fei Li, Beijing (CN); Qian Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 923 days.

(21) Appl. No.: 17/920,486

(22) PCT Filed: Oct. 12, 2021

(86) PCT No.: PCT/CN2021/123338
§ 371 (c)(1),
(2) Date: Oct. 21, 2022

(87) PCT Pub. No.: WO2022/111091
PCT Pub. Date: Jun. 2, 2022

(65) Prior Publication Data
US 2023/0148280 A1 May 11, 2023

(30) Foreign Application Priority Data
Nov. 26, 2020 (CN) .......................... 202011349353.4

(51) Int. Cl.
*H10K 59/131* (2023.01)
*G09G 3/3208* (2016.01)
*H10K 59/12* (2023.01)

(52) U.S. Cl.
CPC ......... *H10K 59/131* (2023.02); *G09G 3/3208* (2013.01); *H10K 59/1201* (2023.02);
(Continued)

(58) Field of Classification Search
CPC .......... H10H 20/83–835; H10H 29/832–8325; H10H 20/032; H10H 29/032; H10K 50/805–828
See application file for complete search history.

(56) References Cited

U.S. PATENT DOCUMENTS

2012/0092605 A1 4/2012 Cheng et al.
2017/0102820 A1 4/2017 Yu et al.
(Continued)

FOREIGN PATENT DOCUMENTS

CN 106920529 A 7/2017
CN 107980167 A 5/2018
(Continued)

OTHER PUBLICATIONS

First Office Action for the Chinese Patent Application No. 202011349353.4 Issued by the Chinese Patent Office on May 7, 2023.

*Primary Examiner* — Christine S. Kim
*Assistant Examiner* — Cole Leon Lindsey
(74) *Attorney, Agent, or Firm* — XSENSUS LLP

(57) ABSTRACT

A driving backplane includes: a substrate; a first conductive layer disposed on the substrate; an insulating layer disposed on a side of the first conductive layer away from the substrate; and a second conductive layer disposed on a side of the insulating layer away from the substrate. The first conductive layer includes a first electrode, the first electrode includes a first sub-electrode and a second sub-electrode surrounding the first sub-electrode, and the second sub-electrode and the first sub-electrode have no gap therebetween. The second conductive layer includes a second electrode. An orthographic projection of the second electrode on the substrate coincides with an orthographic projection of the first sub-electrode on the substrate. The first sub-electrode, the second electrode and a portion of the (Continued)

insulating layer located therebetween constitute a first capacitor.

18 Claims, 17 Drawing Sheets

(52) U.S. Cl.
CPC .............. *G09G 2300/0426* (2013.01); *G09G 2300/0819* (2013.01); *G09G 2300/0842* (2013.01); *G09G 2310/0202* (2013.01); *G09G 2320/0233* (2013.01)

(56) References Cited

U.S. PATENT DOCUMENTS

| | | | | |
|---|---|---|---|---|
| 2019/0393296 A1* | 12/2019 | An | ......................... | H10D 1/692 |
| 2020/0099013 A1* | 3/2020 | Wang | ...................... | H10F 39/80 |
| 2022/0376212 A1* | 11/2022 | Zhou | ................. | H10K 59/8792 |

FOREIGN PATENT DOCUMENTS

| | | | |
|---|---|---|---|
| CN | 109188231 A | 1/2019 |
| CN | 110491881 A | 11/2019 |
| CN | 111261682 A | 6/2020 |
| CN | 111323984 A | 6/2020 |
| CN | 112490270 A | 3/2021 |

\* cited by examiner

L (a)

(b)

A-A'

100

(a)

(b)

$\left.\begin{matrix} 111 \\ 112 \end{matrix}\right\}$ 11     $\left.\begin{matrix} 111 \\ 21 \end{matrix}\right\}$ C1

DRIVING BACKPLANE AND METHOD FOR MANUFACTURING THE SAME, DISPLAY PANEL, AND DISPLAY APPARATUS

CROSS-REFERENCE TO RELATED APPLICATIONS

This application is a national phase entry under 35 USC 371 of International Patent Application No. PCT/CN2021/123338, filed on Oct. 12, 2021, which claims priority to Chinese Patent Application No. 202011349353.4, filed on Nov. 26, 2020, which are incorporated herein by reference in their entirety.

TECHNICAL FIELD

The present disclosure relates to the field of display technologies, and in particular, to a driving backplane and a method for manufacturing the same, a display panel, and a display apparatus.

BACKGROUND

At present, the market has a great demand for high-frame-frequency display panels. Self-luminous display devices have become a hot spot for display products at present due to their advantages such as small thickness, light weight, wide viewing angle, active light emitting, continuously adjustable color, low cost, quick response, low energy consumption, low driving voltage, wide operating temperature range, simple production process, high luminous efficiency, etc.

SUMMARY

In an aspect, a driving backplane is provided. The driving backplane includes a substrate, a first conductive layer, an insulating layer and a second conductive layer. The first conductive layer is disposed on the substrate. The insulating layer is disposed on a side of the first conductive layer away from the substrate. The second conductive layer is disposed on a side of the insulating layer away from the substrate. The first conductive layer includes a first electrode; the first electrode includes a first sub-electrode and a second sub-electrode surrounding the first sub-electrode; and the second sub-electrode and the first sub-electrode have no gap therebetween. The second conductive layer includes a second electrode. An orthographic projection of the second electrode on the substrate coincides with an orthographic projection of the first sub-electrode on the substrate. The first sub-electrode, the second electrode and a portion of the insulating layer located therebetween constitute a first capacitor.

In some embodiments, the first capacitor is included in a pixel circuit in the driving backplane.

In some embodiments, the second electrode has no opening.

In some embodiments, a distance between an edge of the orthographic projection of the second electrode on the substrate and an edge of an orthographic projection of the first electrode on the substrate is greater than or equal to 1 μm.

In some embodiments, the second conductive layer further includes third electrodes. The third electrodes are located on two opposite sides of the second electrode. The third electrodes are connected to the second electrode, orthographic projections of the third electrodes on the substrate are within an orthographic projection of the second sub-electrode on the substrate, and an edge of a third electrode of the third electrodes away from the second electrode is flush with a portion of an edge of the second sub-electrode. The third electrode, a portion of the second sub-electrode that overlaps with the third electrode and a portion of the insulating layer located therebetween constitute a second capacitor. A width of the third electrode is less than a width of the second electrode.

In some embodiments, widths of the third electrodes located on the two opposite sides of the second electrode are equal.

In some embodiments, the number of second electrodes is multiple. The second conductive layer further includes a connection line. An orthographic projection of the connection line on the substrate does not overlap with the orthographic projection of the second sub-electrode on the substrate. The connection line is connected to two adjacent third electrodes, and the two adjacent third electrodes are connected to two adjacent second electrodes of the second electrodes, respectively. A width of the connection line is equal to the width of the third electrode.

In some embodiments, the driving backplane further includes a third conductive layer. The third conductive layer is disposed on a side of the second conductive layer away from the substrate. The third conductive layer includes a first conductive pattern. The first conductive pattern is coupled to the second sub-electrode.

In some embodiments, an orthographic projection of the first conductive pattern on the substrate does not overlap with the orthographic projection of the second electrode on the substrate.

In some embodiments, the driving backplane further includes an active pattern layer. The active pattern layer is disposed on the substrate and located on a side of the substrate proximate to the first conductive layer. The active pattern layer includes a semiconductor pattern and a conductor pattern. The first conductive pattern is further coupled to a portion of the conductor pattern of the active pattern layer.

In some embodiments, a position where the first conductive pattern is coupled to the second sub-electrode is closer to a position where the first conductive pattern is coupled to the active pattern layer than a position of the first sub-electrode is.

In some embodiments, the third conductive layer further includes power supply voltage lines. A power supply voltage line of the power supply voltage lines is coupled to the second electrode. The second conductive layer further includes a second conductive pattern. The second conductive pattern is coupled to the power supply voltage line.

In some embodiments, the third conductive layer further includes data lines. An orthographic projection of the second conductive pattern on the substrate overlaps with an orthographic projection of a data line of the data lines on the substrate.

In some embodiments, in a case where the second conductive layer includes the connection line, an extending direction of the connection line intersects an extending direction of the power supply voltage lines.

In another aspect, a display panel is provided. The display panel includes the driving backplane as described in any one of the above embodiments.

In yet another aspect, a display apparatus is provided. The display apparatus includes the display panel as described in any of the above embodiments.

In still another aspect, a method for manufacturing a driving backplane is provided. The method includes: forming a first conductive layer on a substrate, the first conductive layer including a first electrode; forming an insulating layer on a side of the driving backplane away from the substrate; and forming a second conductive layer on a side of the insulating layer away from the substrate, the second conductive layer including a second electrode. The first electrode includes a first sub-electrode and a second sub-electrode; an orthographic projection of the first sub-electrode on the substrate coincides with an orthographic projection of the second electrode on the substrate; the second sub-electrode surrounds the first sub-electrode, and the first sub-electrode, the second electrode and a portion of the insulating layer located therebetween constitute a first capacitor.

In some embodiments, forming the second electrode, includes: forming a conductive film on the side of the first conductive layer away from the substrate; forming a photoresist layer on the conductive film; exposing and developing the photoresist layer through a mask, so as to obtain a patterned photoresist layer, the patterned photoresist layer covering a portion of the conductive film located in a region where the first sub-electrode is located; and removing the patterned photoresist layer and a portion of the conductive film that is located outside an orthographic projection of the patterned photoresist layer on the substrate through an etching process, so as to obtain the second electrode with no opening.

BRIEF DESCRIPTION OF THE DRAWINGS

In order to describe technical solutions in the present disclosure more clearly, the accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
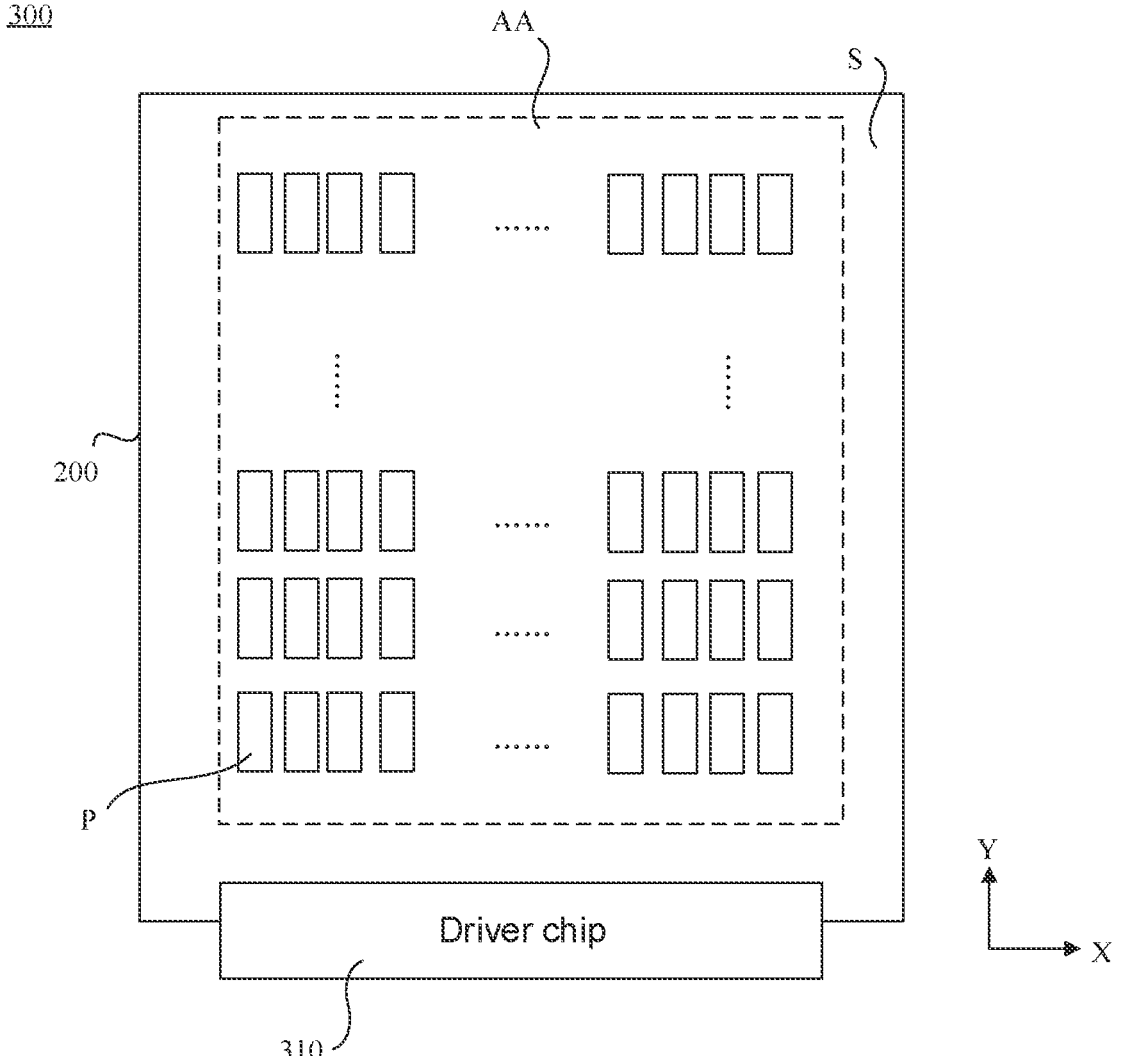
FIG. 1 is a schematic structural diagram of a display apparatus, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed in an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, unless otherwise specified, the term "multiple", "a plurality of" or "the plurality of" means two or more.

In the description of some embodiments, terms such as "coupled" and "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The use of "suitable for" or "configured to" herein means an open and inclusive expression, which does not exclude devices that are applicable to or configured to perform additional tasks or steps.

As used herein, the term "about" or "approximately" includes a stated value and an average value within an acceptable deviation range of a specific value. The acceptable deviation range is determined by a person of ordinary skill in the art in view of the measurement in question and the error associated with the measurement of a particular quantity (i.e., limitations of the measurement system).

Exemplary embodiments are described herein with reference to sectional views and/or plan views as idealized exemplary drawings. In the accompanying drawings, thickness of layers and sizes of regions are enlarged for clarity. Variations in shape relative to the drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Some embodiments of the present disclosure provide a display apparatus. For example, the display apparatus may be any apparatus that displays an image whether in motion (such as a video) or stationary (e.g., a static image), and whether textual or graphical. More specifically, the display apparatus may be one of a variety of electronic devices, and the described embodiments may be implemented in or associated with a variety of electronic devices. The variety of electronic devices include (but are not limit to), for example, mobile telephones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, television (TV) monitors, flat-panel displays, computer monitors, car displays (e.g., odometer displays), navigators, cockpit controllers and/or displays, camera view displays (e.g., displays of rear view cameras in vehicles), electronic photos, electronic billboards or signs, projectors, architectural structures, and packagings and aesthetic structures (e.g., displays for displaying an image of a piece of jewelry). The embodiments of the present disclosure do not limit a specific form of the display apparatus.

In some embodiments, as shown in FIG. 1, the display apparatus 300 includes a display panel 200. The display panel 200 has a display area AA and a peripheral area S. The peripheral area S is located on at least one side of the display area AA.

The display panel 200 includes a plurality of sub-pixels P disposed in the display area AA. For example, the plurality of sub-pixels P may be arranged in an array. For example, sub-pixels P arranged in a line in a first direction X in FIG. 1 are referred to as a same row of sub-pixels, and sub-pixels P arranged in a line in a second direction Y in FIG. 1 are referred to as a same column of sub-pixels.

For example, the plurality of sub-pixels P include sub-pixels of a first color, sub-pixels of a second color and sub-pixels of a third color. For example, the first color, the second color and the third color are three primary colors. For example, the first color, the second color and the third color are red, green and blue, respectively. That is, the plurality of sub-pixels P include red sub-pixels, green sub-pixels and blue sub-pixels.

For example, as shown in FIG. 1, the display apparatus 300 further includes a driver chip 310. For example, the driver chip 310 is a driver integrated circuit (IC). For example, the driver IC includes a source driver. For example, the driver chip 310 is configured to provide driving signals to the sub-pixels in the display panel. For example, the driving signals include data signals.

Figure 2:
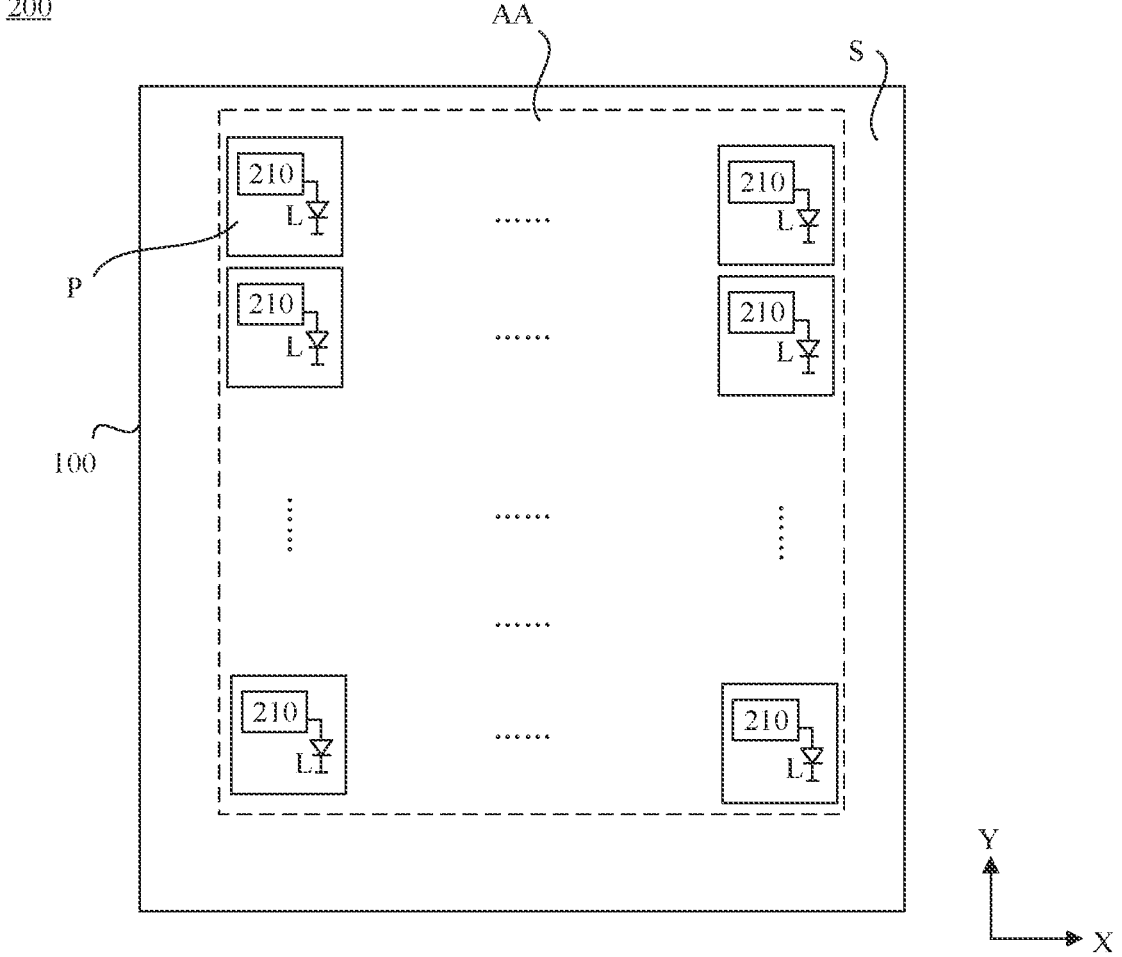
FIG. 2 is a schematic structural diagram of a display panel, in accordance with some embodiments.

In some embodiments, as shown in FIG. 2, the display panel 200 includes a driving backplane 100 and light-emitting devices L. The light-emitting devices L are disposed on the driving backplane 100. The driving backplane 100 may be used to drive the light-emitting devices L to emit light.

As shown in FIG. 2, at least one sub-pixel P (e.g., each sub-pixel P) includes a pixel circuit 210 and a light-emitting device L. The pixel circuit 210 is coupled to the light-emitting device L. The pixel circuit 210 is configured to drive the light-emitting device L to emit light. For example, the pixel circuits are arranged in an array.

In addition, the specific structure of the pixel circuit is not limited in the embodiments of the present disclosure, which may be designed according to actual conditions. For example, the pixel circuit is composed of a thin film transistor (TFT), a capacitor (C), and other electronic devices. For example, the pixel circuit may include two TFTs (a switching transistor and a driving transistor) and a capacitor, which constitute a 2T1C structure. Of course, the pixel circuit may also include more than two TFTs (a plurality of switching transistors and a driving transistor) and at least one capacitor. For example, referring to FIG. 3, the pixel circuit 210 may include a storage capacitor Cst and seven transistors (six switching transistors M1, M2, M3, M4, M5 and M6, and one driving transistor MD), which constitute a 7T1C structure.

Figure 3:
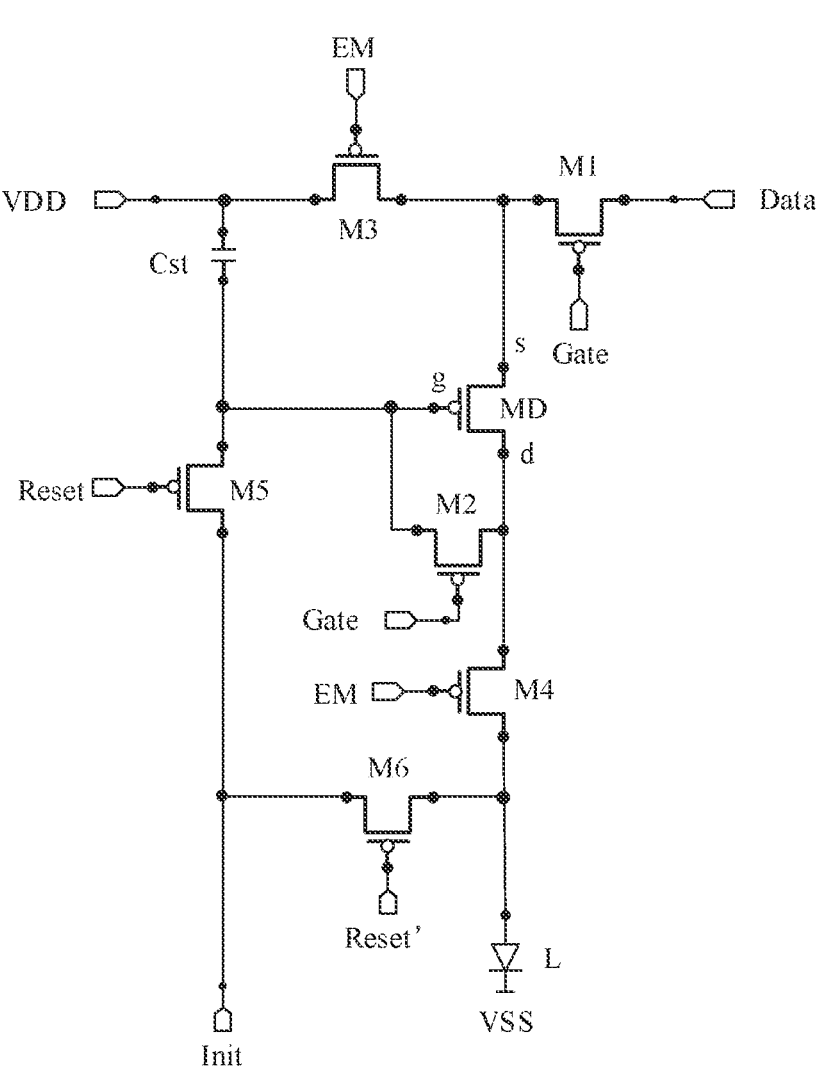
FIG. 3 is a circuit diagram of a pixel circuit, in accordance with some embodiments.

For example, as shown in FIG. 3, control electrodes (gates) of a part of the switching transistors (e.g., M5 and M6) are each used to receive a reset signal. Control electrodes of another part of the switching transistors (e.g., M1 and M2) are used to receive a gate driving signal. Control electrodes of yet another part of the switching transistors (e.g., M3 and M4) are used to receive a light-emitting control signal. For example, the transistor M5 and the transistor M6 are each turned on in response to a respective reset signal, and the transistor M5 and the transistor M6 transmit an initial signal to a control electrode (g) of the driving transistor MD and an anode of the light-emitting device L, respectively, so as to achieve the purpose of resetting the anode of the light-emitting device L and the control electrode of the driving transistor MD. Under control of the gate driving signal, the transistor M2 is turned on; therefore, the control electrode g of the driving transistor MD is coupled to a drain d of the driving transistor MD, and the driving transistor MD is in a diode-conducting state. In this case, a data signal is written into a source s of the driving transistor MD through the transistor M1, so as to compensate a threshold voltage of the driving transistor MD. Under control of the light-emitting control signal, the transistor M3 and the transistor M4 are turned on, and a current path between a first power supply signal and a second power supply signal is turned on. A driving current generated by the driving transistor MD is transmitted to the light-emitting device L through the current path, so as to drive the light-emitting device L to emit light. For example, an electrode (e.g., the anode) of the light-emitting device L receives the driving current from the pixel circuit, and another electrode (e.g., a cathode) of the light-emitting device L is coupled to a fixed voltage terminal VSS. For example, the fixed voltage terminal is configured to transmit a direct-current voltage, such as a direct-current low voltage.

Figure 4:
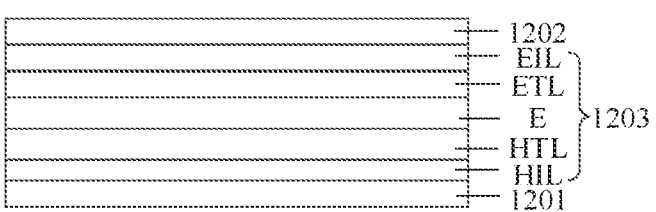
FIG. 4 is a schematic structural diagram of a light-emitting device, in accordance with some embodiments.

For example, the light-emitting device may be a light-emitting diode (LED), an organic light-emitting diode (OLED) or other current-driven light-emitting devices. For example, as shown in FIG. 4, the light-emitting device L includes the cathode 1202, the anode 1201, and a light-emitting functional layer 1203 between the cathode 1202 and the anode 1201. The light-emitting functional layer 1203 may include, for example, a light-emitting layer E, a hole transporting layer (HTL) disposed between the light-emitting layer E and the anode 1201, and an electron transporting layer (ETL) disposed between the light-emitting layer E and the cathode 1202. Of course, in some embodiments, a hole injection layer (HIL) may be provided between the HTL and the anode 1201, and an electron injection layer (EIL) may be provided between the ETL and the cathode 1202, according to actual needs.

For example, the anode may be made of, for example, a transparent conductive material with a high work function, and the electrode material of the anode may include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), or carbon nanotubes. For example, the cathode may be made of a material with a high conductivity and low work function, and the electrode material of the cathode may include a magnesium aluminum (MgAl) alloy, a lithium aluminum (LiAl) alloy and other alloys, or magnesium (Mg), aluminum (Al), lithium (Li), silver (Ag) and other pure metals. The material of the light-emitting layer may be selected according to the color of the emitted light. For example, the material of the light-emitting layer includes a fluorescent light-emitting material or a phosphorescent light-emitting material. For example, in at least one embodiment of the present disclosure, the light-emitting layer involves a doping process, that is, adding a doping material into a host light-emitting material to obtain a usable light-emitting material. For example, the host luminescent material may be a metal compound material, a derivative of anthracene, an aromatic diamine compound, a triphenylamine compound, an aromatic triamine compound, a derivative of biphenyl diamine, or a triarylamine polymer, etc.

With the continuous improvement of user experience requirements of display products, the requirements for display images are also getting higher and higher. For example, in experience scenarios such as movies and games, the display products need to have a high refresh rate. For example, the refresh rate is increased from 60 Hz to 90 Hz, or to 120 Hz. Due to the increase of the refresh rate, a display duration of one frame (1 frame) of the display panel and a display duration of one row (1H) of the display panel decrease accordingly. For example, for a display product with a resolution of 1080×2340, in a case where the refresh rate is 60 Hz, the display duration of one frame is 16667 µs, and the display duration of one row is 7.1 µs; in a case where the refresh rate is 90 Hz, the display duration of one frame is 11111 µs, and the display duration of one row is 4.7 µs; in a case where the refresh rate is 120 Hz, the display duration of one frame is 8333 µs, and the display duration of one row is 3.6 µs. Therefore, a charging time of a high-frequency display product is short; and if the storage capacitor in the pixel circuit has a large capacitance, it cannot match the charging time of the high-frequency display product, which causes the display effect to be reduced.

In some embodiments, under a condition of ensuring that a size (e.g., a width to length ratio) of the driving transistor of the pixel circuit remains unchanged, by reducing an overlapping area of two electrodes of the storage capacitor, the capacitance of the storage capacitor may be reduced to match the charging time of the high-frequency display product. For example, referring to FIG. 5, overlapping portions of a first electrode 11' and a second electrode 21', and a portion of an insulating layer located therebetween constitute a capacitor, which is a storage capacitor in a pixel circuit. The second electrode 21' has an opening K, and an outer edge of an orthographic projection of the second electrode 21' on a substrate 101' is beyond an edge of an orthographic projection of the first electrode 11' on the substrate 101'. For example, by enlarging an area of the opening of the second electrode 21', an overlapping area of the first electrode 11' and the second electrode 21' may be reduced. For example, a dimension of the opening of the second electrode 21' in a column direction in which the pixel circuits are arranged (i.e., the second direction in FIG. 5) is enlarged, and enlarge a dimension of the opening of the second electrode 21' in a row direction in which the pixel circuits arranged (i.e., the first direction X in FIG. 5) is enlarged synchronously. Correspondingly, a distance between an edge of an orthogonal projection of the opening K of the second electrode 21' on the substrate 101' and the edge of the orthogonal projection of the first electrode 11' on the substrate 101' is also reduced.

In this case, the overlapping area of the first electrode 11' and the second electrode 21' is small, for example, less than half of an area of the first electrode 11'. Therefore, due to a fluctuation during a production process, a width J of the opening of the second electrode 21' fluctuates greatly in the column direction in which the pixel circuits are arranged (i.e., the second direction Y in FIG. 5), or a relative position of the first electrode 11' and the second electrode 21' is prone to shift. As a result, a large difference in overlapping areas of first electrodes 11' and second electrodes 21' in different pixel circuits, which leads to a large difference in driving currents output by the pixel circuits.

Figure 5:
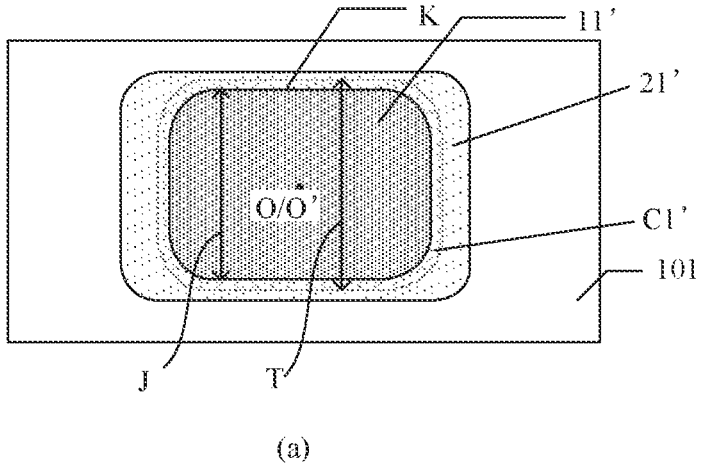
FIG. 5 is a comparison diagram of offsets of first capacitors, in accordance with some embodiments.
Figure 5:
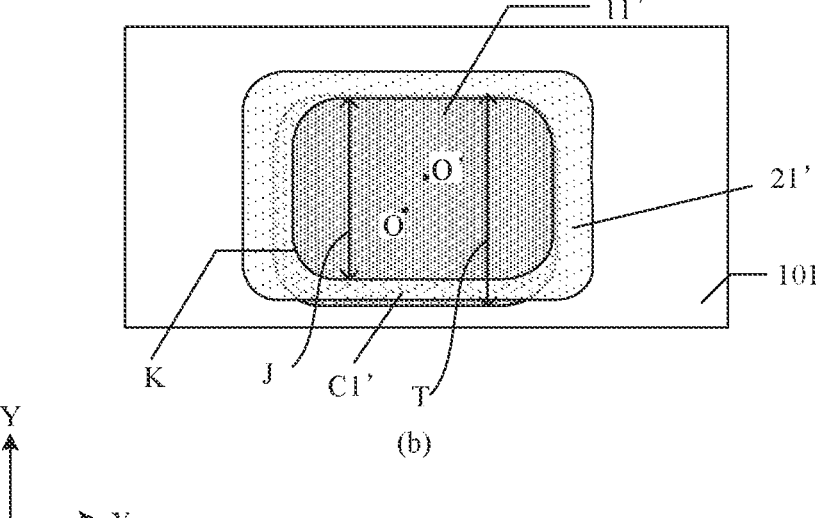

For example, for a same display panel, the portions of the first electrode 11' and the second electrode 21' of the storage capacitor in the pixel circuit that are overlapped with each other are not shifted (e.g., as shown in part (a) in FIG. 5), a geometric center (or center of gravity) O' of the opening K of the second electrode 21' coincides with a geometric center (or center of gravity) O of the first electrode 11', the capacitance of the storage capacitor is about 38 fF, and driving currents of a corresponding red sub-pixel, a corresponding green sub-pixel and a corresponding blue sub-pixel are I_R, I_G and I_B respectively. If the portions of the first electrode 11' and the second electrode 21' of the storage capacitor in the pixel circuit that are overlapped with each other are shifted (e.g., the part (b) in FIG. 5), the geometric center (or center of gravity) O' of the opening K of the second electrode 21' does not coincide with the geometric center (or center of gravity) O of the first electrode 11'. For example, the overlapping area of the first electrode 11' and the second electrode 21' fluctuates and decreases by about 10%, and the width J of the opening K of the second electrode 21' fluctuates and increases by about 4%, so that the capacitance decreases to about 34 fF, and the driving current of the pixel circuit in the corresponding red sub-pixel is I_R×30%, the driving current of the pixel circuit in the corresponding green sub-pixel is I_G×35%, and the driving current of the pixel circuit in the corresponding blue sub-pixel is I_B×50%. Thus, when a low gray-scale image is displayed, the uniformity of the brightness and the color coordinates of the display image are affected, resulting in a reduction in the display effect.

Figure 6:
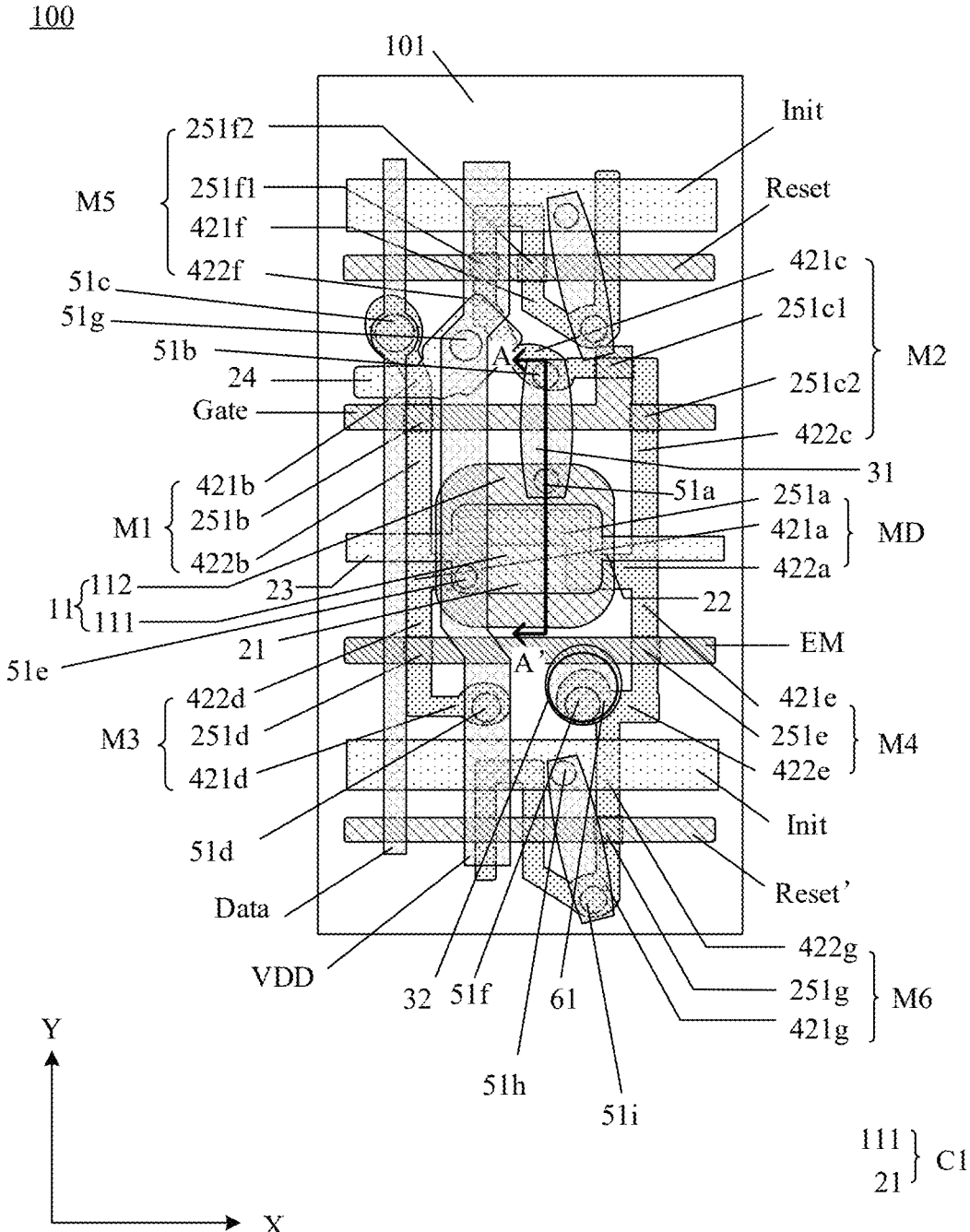
FIG. 6 is a structural diagram of a driving backplane, in accordance with some embodiments.
Figure 7:
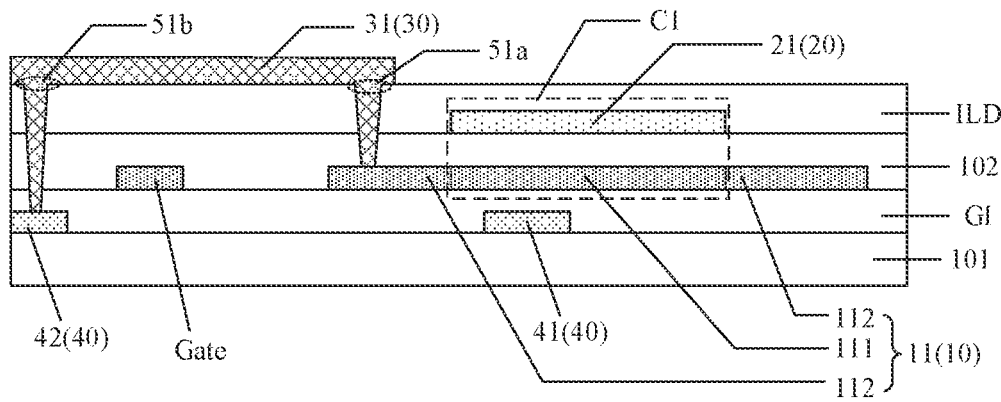
FIG. 7 is a sectional view of the driving backplane in FIG. 6 taken along the A-A' direction.
Figure 8:
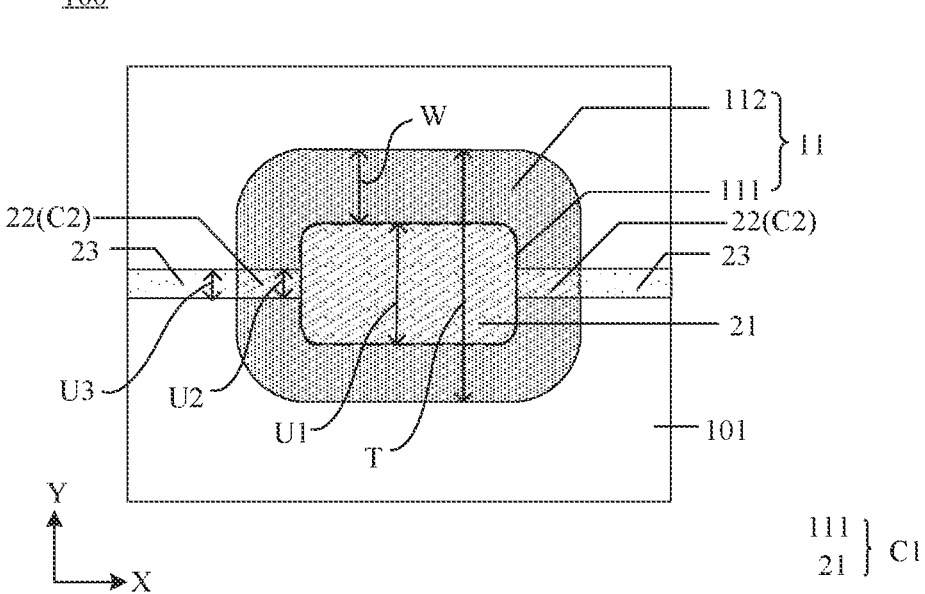
FIG. 8 is a structural diagram of another driving backplane, in accordance with some embodiments.

As shown in FIGS. 6 to 8, the driving backplane 100 provided in some embodiments of the present disclosure includes a substrate 101, a first conductive layer 10, an insulating layer 102 and a second conductive layer 20. The first conductive layer 10 is disposed on the substrate 101. The insulating layer 102 is disposed on a side of the first conductive layer 10 away from the substrate 101. The second conductive layer 20 is disposed on a side of the insulating layer 102 away from the substrate 101.

For example, the substrate 101 may be a rigid substrate (also referred to as a hard substrate) such as a glass substrate, or a flexible substrate such as a polyimide (PI) substrate. The rigid substrate or flexible substrate is provided with a buffer layer and other thin films thereon.

For example, the material of the insulating layer 102 may include an inorganic material, such as silicon oxide, silicon nitride, or silicon oxynitride.

As shown in FIGS. 6 to 8, the first conductive layer 10 includes first electrode(s) 11. The first electrode(s) 11 each include a first sub-electrode 111 and a second sub-electrode 112. The second sub-electrode 112 surrounds the first sub-electrode 111, and the second sub-electrode 112 and the first sub-electrode 111 have no gap therebetween. For example, the first sub-electrode 111 and the second sub-electrode 112 are connected into an integrated structure. For example, edges of an orthographic projection of the second sub-electrode 112 on the substrate 101 enclose an annulus. For example, an inner edge of the orthographic projection of the second sub-electrode 112 on the substrate 101 encloses a figure, which is approximately a quadrilateral; an outer edge of the orthographic projection of the second sub-electrode 112 on the substrate 101 encloses a figure, which is approximately a quadrilateral. An edge of an orthographic projection of the first sub-electrode 111 on the substrate 101 encloses a figure, which is approximately a quadrilateral.

As shown in FIGS. 6 to 8, the second conductive layer 20 includes second electrode(s) 21. An orthographic projection of the second electrode 21 on the substrate 101 overlaps with the orthographic projection of the first sub-electrode 111 on the substrate 101. The first sub-electrode 111, the second electrode 21 and a portion of the insulating layer 102 located therebetween constitute a first capacitor C1. For example, the first capacitor C1 is included in the pixel circuit in the driving backplane. For example, the first capacitor C1 is the storage capacitor in the pixel circuit.

It will be understood that, the orthographic projection of the second electrode on the substrate has the same area as the orthographic projection of the first sub-electrode on the substrate. The capacitance of the first capacitor is related to the size of an overlapping area of the first sub-electrode and the second electrode. Since the second sub-electrode surrounds the first sub-electrode, the orthographic projection of the first sub-electrode on the substrate is not beyond the outer edge of the orthographic projection of the second sub-electrode on the substrate. Correspondingly, the orthographic projection of the second electrode on the substrate is not beyond the outer edge of the orthographic projection of the second sub-electrode on the substrate. That is, the orthographic projection of the second electrode on the substrate is located within an orthographic projection of the first electrode on the substrate. Therefore, the orthographic projection of the second electrode on the substrate can be shifted within the orthographic projection of the first electrode on the substrate.

Figure 9:
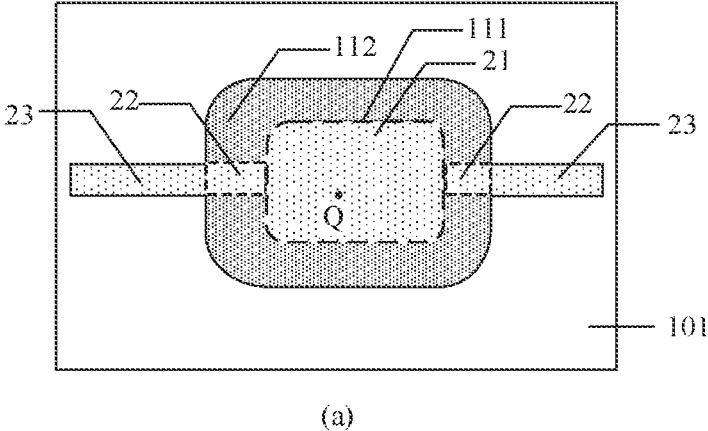
FIG. 9 is a comparison diagram of offsets of first capacitors, in accordance with some other embodiments.
Figure 9:
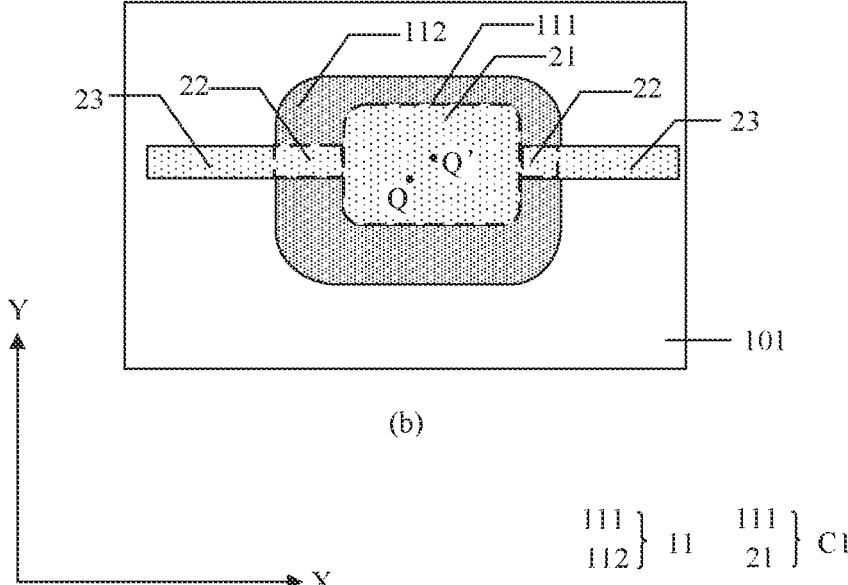

For example, part (a) in FIG. 9 shows an initial position of the second electrode 21, part (b) in FIG. 9 shows a shifted position of the second electrode 21. After the second electrode 21 moves from the initial position Q to the shifted position Q' relative to the first electrode 11, the second electrode 21 is still located within a region where the first electrode 11 is located. In this case, the overlapping area of the second electrode and the first electrode before shifting is the same as the overlapping area of the second electrode and the first electrode after the shifting, so that the capacitance of the first capacitor before the shifting is the same as the capacitance of the first capacitor after the shifting.

Moreover, in the first capacitor C1', the distance between the edge of the orthogonal projection of the opening K of the second electrode 21' on the substrate 101' and the edge of the orthogonal projection of the first electrode 11' on the substrate 101' is small; in a case where the edge of the second electrode fluctuates due to the process deviation (for example, in the first capacitor C1', the edge of the opening K of the second electrode 21' expands toward the edge of the first electrode 11'), the edge of the opening K and the edge of the first electrode 11' do not have enough space therebetween for expansion, so that the edge of the opening K is prone to extend beyond the edge of the first electrode 11', which leads to a large capacitance deviation of the first capacitor C1'. However, in the first capacitor C1, a distance between an edge of the orthographic projection of the second electrode 21 on the substrate 101 and an edge of the orthographic projection of the first electrode 11 on the substrate 101 is large; in a case where the edge of the second electrode fluctuates due to the process deviation (for example, in the first capacitor C1, the edge of the second electrode 21 expands to the edge of the first electrode 11), there is enough space for expansion of the edge of the second electrode 21, so that a large capacitance deviation of the first capacitor C1 caused by the edge of the second electrode 21 moving beyond the edge of the first electrode 11 may be avoided.

In this case, in the production process, the second electrode is shifted due to the process fluctuation, and the position of the shifted second electrode is still located within the region where the first electrode is located, so that the overlapping area of the two electrodes of the first capacitor will not change, which may avoid the large capacitance deviation of the first capacitor, and ensure the uniformity of the capacitance of the first capacitor. In this way, in a case where the first capacitor is included in the pixel circuit, it may avoid the uneven display caused by the large deviation in the capacitances of the storage capacitors in different pixel circuits, and improve the display effect.

Therefore, in the driving backplane provided in the embodiments of the present disclosure, the first conductive layer includes the first electrodes, the first electrode includes the first sub-electrode and the second sub-electrode, the second sub-electrode surrounds the first sub-electrode, and the second sub-electrode and the first sub-electrode have no gap therebetween; the second conductive layer in the driving backplane includes the second electrodes, and the orthographic projection of the second electrode on the substrate coincides with the orthographic projection of the first sub-electrode on the substrate. The first sub-electrode, the second electrode and the portion of the insulating layer located therebetween constitute the first capacitor. In this case, in the production process, the second electrode will shift due to the process fluctuation, and the position of the shifted second electrode is still located within the region where the first electrode is located, so that the overlapping area of the two electrodes of the first capacitor will not change, which may avoid the large capacitance deviation of the first capacitor, and ensure the uniformity of the capacitance of the first capacitor. In a case where the driving backplane is applied to the display, the display effect may be improved, and the uniformity of display image quality may be ensured.

In some embodiments, as shown in FIGS. 6 to 8, the second electrode 21 has no opening. For example, in a direction perpendicular to a plane where the driving backplane 100 is located (e.g., in a thickness direction of the substrate 101), in the second electrode 21 is provided with no through hole therein. For example, an edge of the orthographic projection of the second electrode 21 on the substrate 101 encloses a figure, which is approximately a quadrilateral. For example, the edge of the orthographic projection of the second electrode 21 on the substrate 101 encloses a rectangle with rounded corner(s).

In the process of fabricating the second electrode, for the second electrode 21' referring to FIG. 5, there is an opening K of the second electrode 21'; after exposure and development, a thickness of a portion of a photoresist layer proximate to the opening K is less than a thickness of a portion of the photoresist layer away from the opening K, and the photoresist layer is not uniform. Therefore, during an etching process, a portion of a conductive film proximate to the opening K is prone to be over etched, which results in a deviation in the size of the opening K. That is, the width of the opening K fluctuates. Thus, the overlapping area of the second electrode and the first electrode changes, resulting in a change in the capacitance of the first capacitor.

For the second electrode 21 referring to FIG. 8, the second electrode 21 has no opening; after exposure and development, a thickness of a photoresist layer on a conductive film is uniform, and the photoresist layer is relatively flat. Therefore, the problem of over-etching of the conductive film may be avoided, and the overlapping area of the second electrode and the first electrode may be prevented from changing. That is, the change of the overlapping area of the second electrode and the first sub-electrode is avoided. As a result, it may be possible to avoid the influence of the offset of the overlapping area of the first electrode and the second electrode on the capacitance of the first capacitor, and improve the accuracy of the first capacitor.

Figure 10:
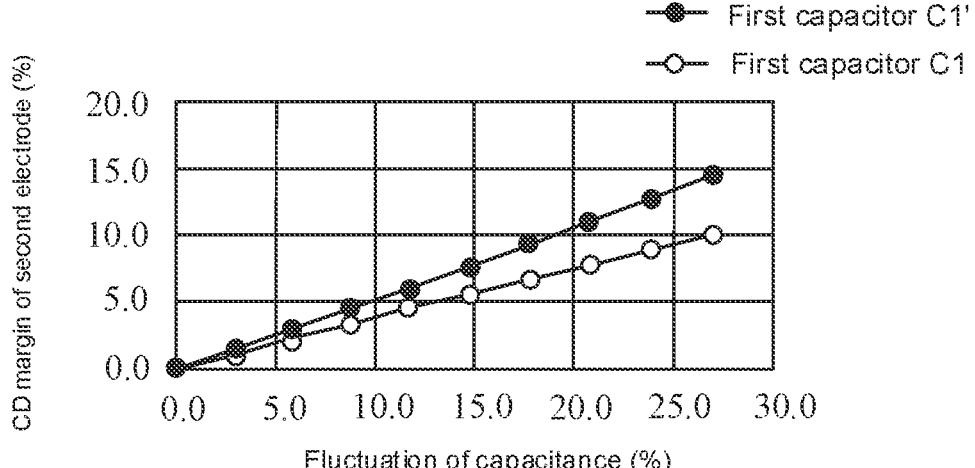
FIG. 10 is a schematic diagram illustrating a relationship between capacitances and CD margins of second electrodes of different first capacitors, in accordance with some embodiments.

Table 1 shows parameter information of the first capacitor C1' (referring to FIG. 5) and the first capacitor C1 (referring to FIG. 8). The critical dimension (CD) of the second electrode of the first capacitor C1' refers to the width J of the opening K of the second electrode 21' of the first capacitor C1' in the column direction in which the pixel circuits are arranged; the CD of the second electrode of the first capacitor C1 refers to the width U1 of the second electrode 21 of the first capacitor C1 in the column direction in which the pixel circuits are arranged; the CD of the first electrode refers to the width T of the first electrode in the column direction in which the pixel circuits are arranged; the CD margin of the second electrode refers to a tolerance of the CD of the second electrode to fluctuate, that is, an allowable range of deviation of the CD of the second electrode. It will be seen that, the capacitances of the first capacitors are the same, the first capacitors have the same CD of the first electrode, and the first capacitors have the same overlapping area of the first electrode and the second electrode. In a case where the fluctuations of the capacitances the first capacitors are the same, the CD margin of the second electrode in the first capacitor C1 is greater than the CD margin of the second electrode in the first capacitor C1' (e.g., referring to FIG. 10). In this way, the tolerance of the first capacitor C1 to the fluctuation of the CD of the second electrode is greater than the tolerance of the first capacitor C1' to the fluctuation of the CD of the second electrode. That is, the allowable range of the process deviation of the second electrode of the first capacitor C1 is greater than that of the second electrode of the first capacitor C1'.

For example, compared with the first capacitor C1' (referring to FIG. 5), the fluctuation of the capacitance of the first capacitor C1 caused by the fluctuation of the CD of the second electrode in the first capacitor C1 (referring to FIG. 8) is small. In a case where the fluctuations of the capacitances are the same (e.g., the fluctuations of the capacitances are each 27%), the fluctuation of the CD of the second electrode in the first capacitor C1 (about 10.0%) is less than the fluctuation of the CD of the second electrode in the first capacitor C1' (about 14.6%). Therefore, the CD margin of the second electrode in the first capacitor C1 is large, which expands the allowable range of the process deviation and reduces the difficulty of production.

In some embodiments, referring to FIG. 8, a distance W between the edge of the orthographic projection of the second electrode 21 on the substrate 101 and the edge of the orthographic projection of the first electrode 11 on the

TABLE 1

| CD of first electrode (µm) | Capacitance (fF) | Fluctuation of capacitance (%) | Overlapping area (µm²) | First capacitor C1' | | First capacitor C1 | |
|---|---|---|---|---|---|---|---|
| | | | | CD of second electrode CD (µm) | CD margin of second electrode (%) | CD of second electrode (µm) | CD margin of second electrode (%) |
| 12 | 38.0 | 0.0 | 63.0 | 9.0 | 0.0 | 7.9 | 0.00 |
| 12 | 36.9 | 2.9 | 61.2 | 9.1 | 1.1 | 7.8 | 1.45 |
| 12 | 35.8 | 5.8 | 59.4 | 9.2 | 2.2 | 7.7 | 2.93 |
| 12 | 34.7 | 8.7 | 57.5 | 9.3 | 3.3 | 7.6 | 4.46 |
| 12 | 33.6 | 11.7 | 55.6 | 9.4 | 4.4 | 7.5 | 6.02 |
| 12 | 32.4 | 14.7 | 53.8 | 9.5 | 5.6 | 7.3 | 7.63 |
| 12 | 31.3 | 17.7 | 51.8 | 9.6 | 6.7 | 7.2 | 9.29 |
| 12 | 30.1 | 20.8 | 49.9 | 9.7 | 7.8 | 7.1 | 10.99 |
| 12 | 28.9 | 23.9 | 48.0 | 9.8 | 8.9 | 6.9 | 12.75 |
| 12 | 27.7 | 27.0 | 46.0 | 9.9 | 10.0 | 6.8 | 14.56 | substrate 101 is greater than or equal to 1 μm. For example, a distance between the outer edge of the orthographic projection of the second sub-electrode 112 on the substrate 101 and the edge of the orthographic projection of the first sub-electrode 111 on the substrate 101 is greater than or equal to 1 μm. In this way, an edge of an overlapping region of the second electrode and the first electrode and the edge of the orthographic projection of the first electrode on the substrate have a large distance therebetween. In the production process, it may be possible to avoid that the second electrode is shifted from the range where the first electrode is located due to the equipment deviation (for example, the equipment deviation is less than or equal to 1 μm), and avoid the change of the overlapping area of the first electrode and the second electrode. As a result, the change of the capacitance of the first capacitor may be avoided, and the uniformity of the capacitance of the storage capacitor in each pixel circuit is ensured.

Figure 11:
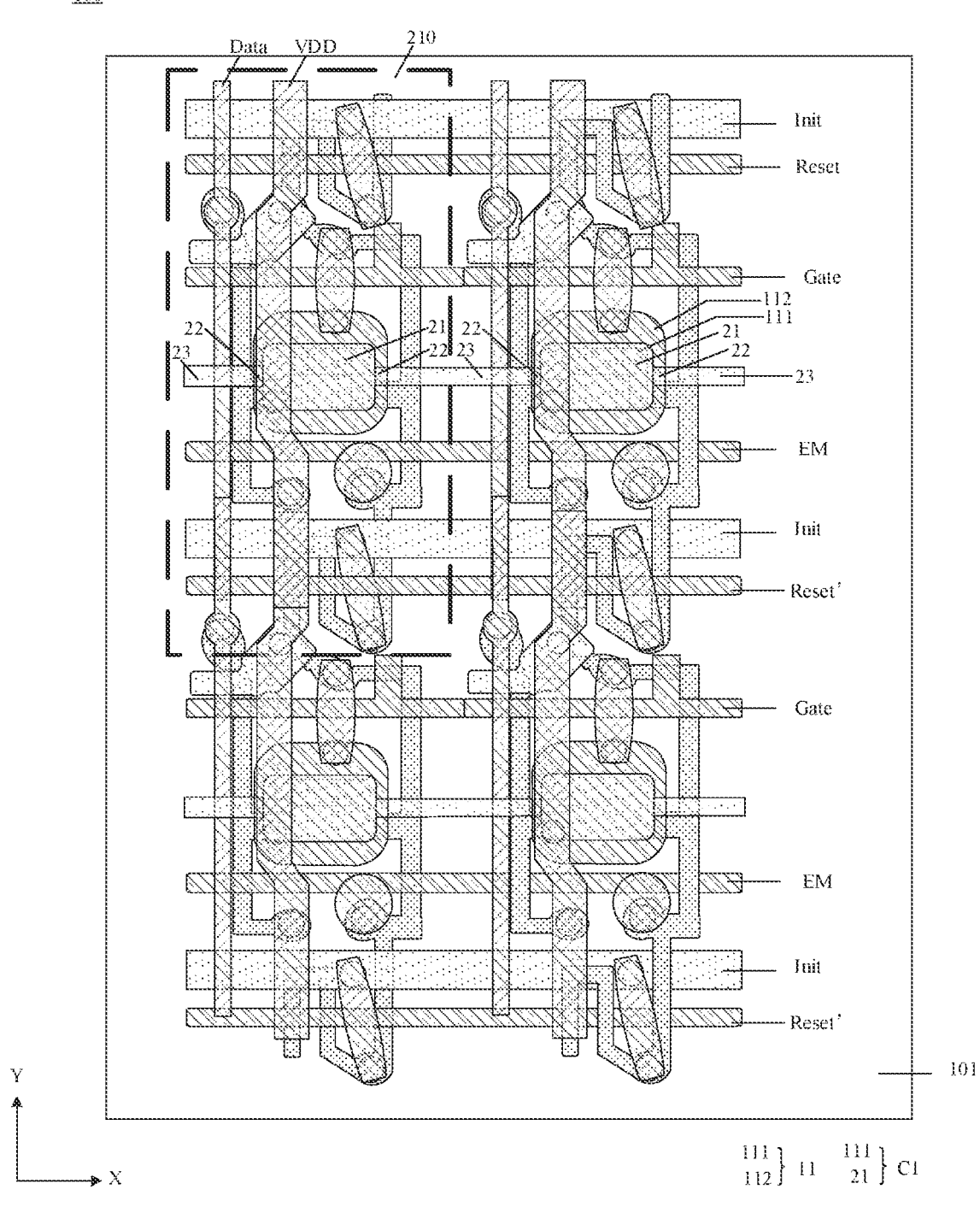
FIG. 11 is a structural diagram of yet another driving backplane, in accordance with some embodiments.
Figure 12:
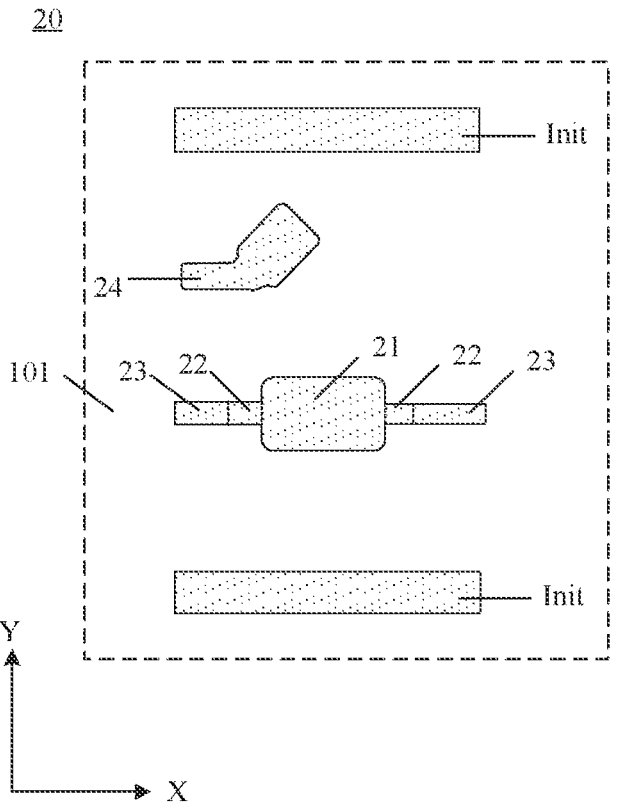
FIG. 12 is a structural diagram of a second conductive layer, in accordance with some embodiments.

In some embodiments, as shown in FIG. 12, the second conductive layer 20 further includes third electrodes 22. The third electrodes 22 are located on two opposite sides of the second electrode 21. For example, in the row direction in which the pixel circuits are arranged (e.g., the first direction X in FIG. 11) or the row direction in which the sub-pixels are arranged, the third electrodes 22 are located on the two opposite sides of the second electrode 21. The third electrodes 22 are connected to the second electrode 21. For example, the third electrode 22 and the second electrode 21 connected thereto have no gap therebetween. For example, the third electrodes 22 and the second electrode 21 are connected into an integrated structure. For example, the third electrodes 22 and the second electrode 21 are made of a same material. In the process, the third electrodes 22 and the second electrode 21 may be formed simultaneously.

Referring to FIG. 8, orthographic projections of the third electrodes 22 on the substrate 101 are within the orthographic projection of the second sub-electrode 112 on the substrate 101, and an edge of the third electrode 22 away from the second electrode 21 is flush with a portion of an edge (e.g., an outer edge) of the second sub-electrode 112. For example, referring to FIG. 8, an orthographic projection of the edge of the third electrode 22 away from the second electrode 21 (e.g., the edge of the third electrode 22 opposite to an edge thereof connected to the second electrode 21 in the first direction X in FIG. 8) on the substrate 101 coincides with an orthographic projection of the portion of the edge of the second sub-electrode 112 on the substrate 101, or is on a same straight line as the orthographic projection of the portion of the edge of the second sub-electrode 112 on the substrate 101.

The third electrode 22, a portion of the second sub-electrode 112 that overlaps with the third electrode 22, and a portion of the insulating layer located therebetween constitute a second capacitor C2. For example, since the two third electrodes 22 are located on the two opposite sides of the second electrode 21 respectively, the first capacitor C1 is connected in parallel with two second capacitors C2. In this case, the first capacitor C1 and the second capacitors C2 may be collectively regarded as the storage capacitor in the pixel circuit, and the capacitance of the storage capacitor in the pixel circuit may be improved.

Referring to FIG. 8, a width U2 of the third electrode 22 is less than the width U1 of the second electrode 21. For example, the column direction in which the pixel circuits are arranged (e.g., the second direction Y in FIG. 11) or the column direction in which the sub-pixels are arranged is a width direction of the third electrode 22. For example, a capacitance of the second capacitor C2 is less than the capacitance of the first capacitor C1.

For example, widths of the third electrodes 22 on the two opposite sides of the second electrode 21 are equal. In this case, in the plane where the driving backplane is located, in a case where the second electrode is shifted in a direction (e.g., referring to the first direction X in FIG. 9) perpendicular to the width direction of the third electrode, for different pixel circuits, offsets of the third electrodes 22 on the two opposite sides of the second electrode 21 are approximately equal, which avoids the problem that the capacitance of the storage capacitor in the pixel circuit changes greatly. For example, in a case where the process deviations are approximately the same, when a second electrode 21 in one pixel circuit is shifted to the right in the first direction X in FIG. 9, a third electrode 22 on the right side of the second electrode 21 moves out by an amount q relative to a second sub-electrode 112 in the one pixel circuit; when a second electrode 21 in another pixel circuit is shifted to the left in the first direction X in FIG. 9, a third electrode 22 on the left side of the second electrode 21 moves out by an amount q' relative to a second sub-electrode 112 in the another pixel circuit; the amount q' is approximately equal to the amount q. In this case, a capacitance of a storage capacitor in the one pixel circuit has a small difference with a capacitance of a storage capacitor in the another pixel circuit, which may avoid the display difference.

In some embodiments, there are a plurality of second electrodes 21. It will be understood that, there are a plurality of first capacitors. For example, there are a plurality of pixel circuits 210 in the driving backplane 100 (referring to FIG. 11), and there are a plurality of storage capacitors included in the pixel circuits 210, and the storage capacitors may be the first capacitors. For example, the plurality of pixel circuits are arranged in an array; the plurality of first capacitors are arranged in an array; and the plurality of second electrodes are arranged in an array.

For example, as shown in FIG. 12, the second conductive layer 20 further includes connection line(s) 23. Referring to FIG. 11, an orthographic projection of the connection line 23 on the substrate 101 does not overlap with the orthographic projection of the second sub-electrode 112 on the substrate 101. The connection line 23 is connected to two adjacent third electrodes 22, and the two adjacent third electrodes 22 are connected to two adjacent second electrodes 21, respectively. For example, in the row direction in which the pixel circuits are arranged (e.g., the first direction X in FIG. 11), the connection line 23 is connected to the two adjacent third electrodes 22, and the two adjacent third electrodes 22 are connected to second electrodes 21 in two adjacent pixel circuits in a row of pixel circuits, respectively.

It will be understood that, third electrodes located between two adjacent second electrodes are connected through a connection line. For example, the two adjacent second electrodes are connected to the third electrodes through the connection line, so as to form a one-piece structure. In this case, the two adjacent second electrodes and the third electrodes connected thereto may maintain a same voltage, thereby avoiding voltage deviation.

Referring to FIG. 8, a width U3 of the connection line 23 is equal to the width U2 of the third electrode 22. For example, in the plane where the driving backplane is located, a width direction of the connection line is perpendicular to an extending direction of the connection line. For example, the width direction of the connection line is the same as the column direction in which the pixel circuits are arranged. For example, the width direction of the connection line is the second direction Y in FIG. 8. For example, in the extending direction of the connection line (e.g., the first direction X in FIG. 8), an edge of a portion of the connection line connected to the third electrode is flush with a portion of the edge of the third electrode. For example, an orthographic projection of the edge of the portion of the connection line connected to the third electrode on the substrate and an orthographic projection of the edge of the portion of the third electrode on the substrate are parallel to each other (i.e., on a same straight line). In this case, if the second electrode is shifted due to the production equipment deviation in the manufacturing process, the third electrode and the connection line will also be shifted accordingly. In this case, since the width of the connection is equal to the width of the third electrode, an offset of the connection line is equal to an offset of the third electrode. As a result, the capacitance of the second capacitor may remain unchanged.

For example, referring to FIG. 9, the second electrode 21 is shifted to the right in the first direction X; and accordingly, the two third electrodes 22 coupled to the second electrode 21 are shifted to the right. The third electrode 22 on the right side of the second electrode 21 is shifted to the right relative to the second sub-electrode 112, and moves out of the region where the first electrode is located. That is, an orthographic projection, on the substrate 101, of a shifted portion of the third electrode 22 located on the right side of the second electrode 21 does not overlap with the orthographic projection, on the substrate 101, of the second sub-electrode 112. The connection line connected to the third electrode 22 that is located on the left side of the second electrode 21 is shifted to the right, and moves into the region where the first electrode is located. An orthographic projection of a shifted portion on the substrate 101 overlaps with the orthographic projection of the second sub-electrode 112 on the substrate 101. An area of the orthographic projection, on the substrate, of the shifted portion of the connection line that moves into the region where the first electrode is located is equal to an area of the orthographic projection, on the substrate, of the shifted portion of the third electrode that moves out of the region where the first electrode is located, so that the shifted portion of the connection line that moves into the region where the first electrode is located compensates the shifted portion of the third electrode that moves out of the region where the first electrode is located. In this case, an overlapping area of the orthographic projection of the second sub-electrode 112 on the substrate 101 and the orthographic projections of the second electrode 21, the third electrodes 22 and the connection line 23 on the substrate 101 remains unchanged. Therefore, a sum of the capacitances of the second capacitors on the two opposite sides of the shifted second electrode remains unchanged. That is, a sum of the capacitance of the first capacitor and the capacitances of the second capacitors remains unchanged. As a result, it may be possible to avoid the change of the capacitance of the capacitor due to the process deviation, and avoid the deviation of the grayscale display of the sub-pixel corresponding to the pixel circuit.

In some embodiments, referring to FIGS. 6 and 7, the driving backplane 100 further includes a third conductive layer 30. The third conductive layer 30 is disposed on a side of the second conductive layer 20 away from the substrate 101. The third conductive pattern 30 includes first conductive pattern(s) 31. The first conductive pattern 31 is coupled to the second sub-electrode 112. For example, an orthographic projection of the first conductive pattern 31 on the substrate 101 does not overlap with the orthographic projection of the second conductive pattern 21 on the substrate 101.

For example, the third conductive layer 30 is insulated from the second conductive layer 20. For example, as shown in FIG. 7, an interlayer dielectric layer ILD is provided between the third conductive layer 30 and the second conductive layer 20. For example, the interlayer dielectric layer ILD is provided with a via hole 51a therein, and the first conductive pattern 31 is in contact with the second sub-electrode 112 through the via hole 51a. It will be understood that, a position where the first conductive pattern 31 contacts the second sub-electrode 112 is located outside the first sub-electrode 111. That is, an orthographic projection, on the substrate 101, of the position where the first conductive pattern 31 contacts the second sub-electrode 112 is located outside the orthographic projection, on the substrate 101, of the second electrode 21.

In some embodiments, referring to FIGS. 6 and 7, the driving backplane 100 includes an active pattern layer 40. The active pattern layer 40 is disposed on the substrate 101 and located on a side of the substrate 101 proximate to the first conductive layer 10. For example, the active pattern layer 40 is insulated from the first conductive layer 10. For example, as shown in FIG. 7, a gate insulating layer GI is provided between the active pattern layer 40 and the first conductive layer 10.

As shown in FIG. 7, the active pattern layer 40 includes a semiconductor pattern 41 and a conductor pattern 42. For example, a semiconductor material film is formed on the substrate 101, and a treatment, for example, ion doping, is performed on a portion of the semiconductor material film to alter its conducting properties, so as to obtain the conductor pattern 42; then, a portion of the semiconductor material film which is not subjected to the treatment is the semiconductor pattern 41.

For example, the pixel circuit includes a plurality of transistors, and each transistor includes an active layer. The active layer includes a channel region, a first electrode region and a second electrode region. The first electrode region and the second electrode region are located at two sides of the channel region. For example, one of the first electrode region and the second electrode region is a source region, and the other is a drain region. It will be understood that, the semiconductor pattern includes the channel region of the active layer, and the conductor pattern includes the first electrode region and the second electrode region of the active layer.

The first conductive pattern 31 is further coupled to a portion of the conductor pattern 42 of the active pattern layer 40. It will be understood that, the first conductive pattern 31 couples the second sub-electrode 112 in the first electrode 11 to the portion of the conductor pattern 42.

Figure 13:
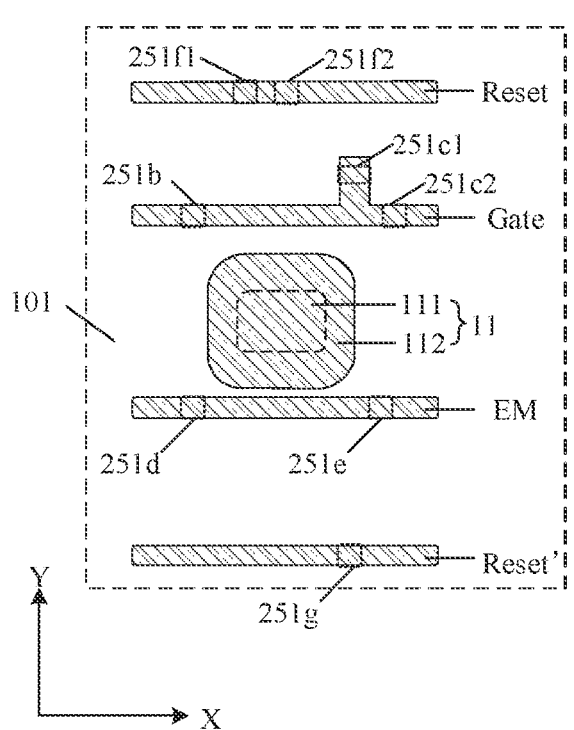
FIG. 13 is a structural diagram of a first conductive layer, in accordance with some embodiments.
Figure 14:
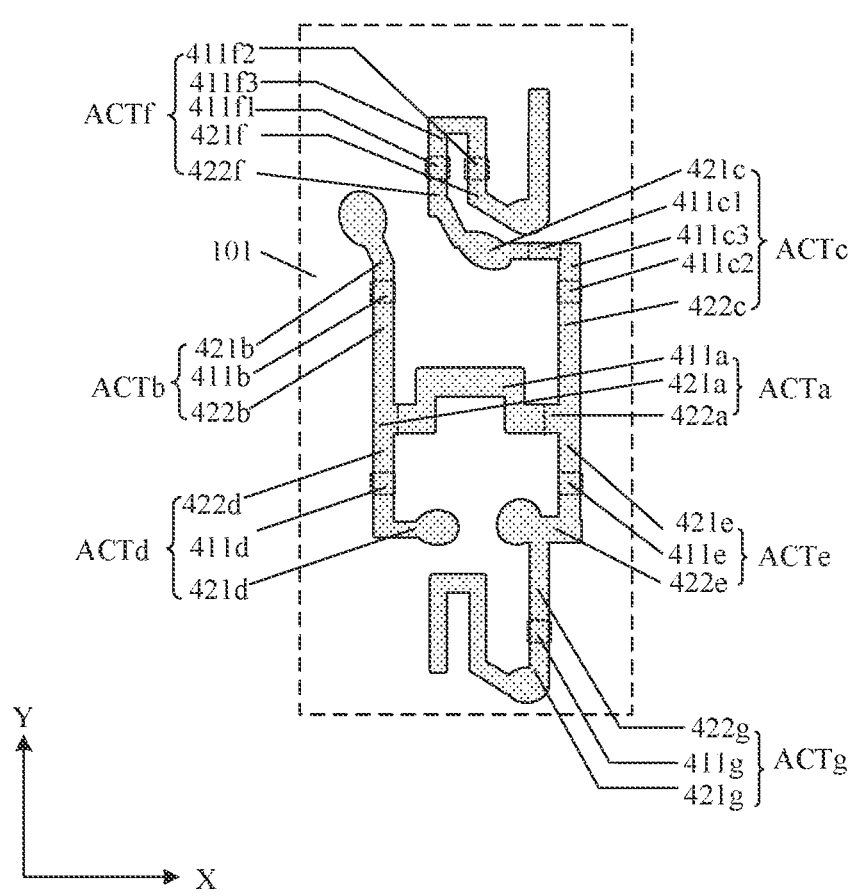
FIG. 14 is a structural diagram of an active pattern layer, in accordance with some embodiments.
Figure 15:
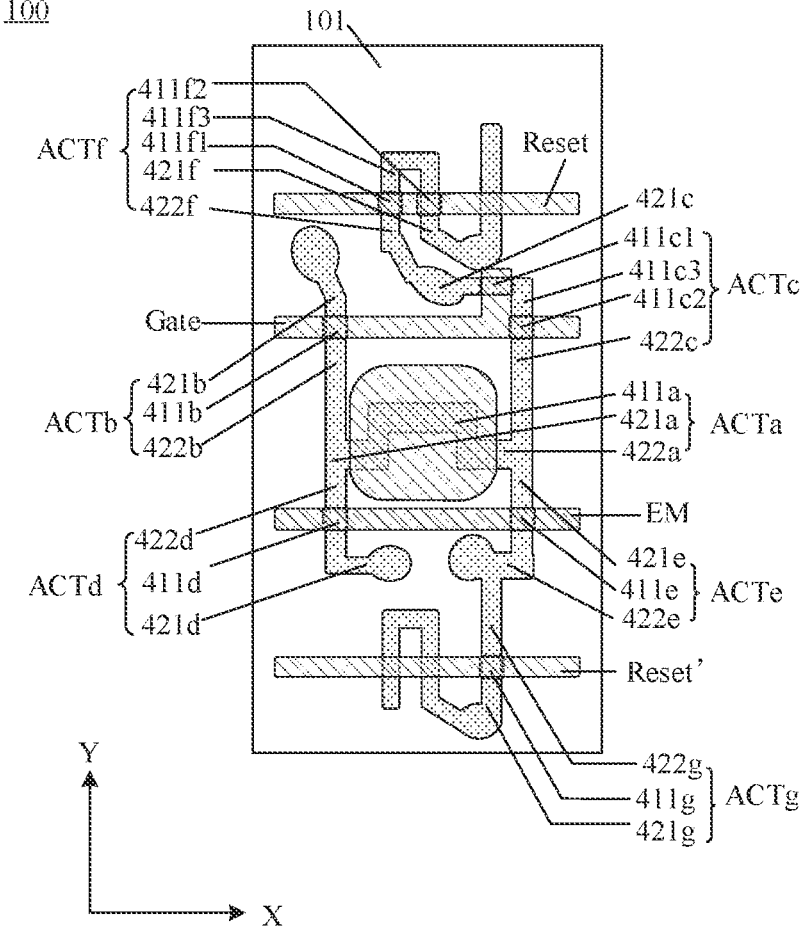
FIG. 15 is a structural diagram of yet another driving backplane, in accordance with some embodiments.

Referring to FIG. 3, the plurality of transistors in the pixel circuit 210 include the driving transistor MD. Referring to FIG. 13 to 15, an orthographic projection of a portion of the active pattern layer 40 on the substrate 101 overlaps with the orthographic projection of the first electrode 11 in the first conductive layer 10 on the substrate 101, and the portion of the active pattern layer 40 is used as a channel region 411a of an active layer ACTa of the driving transistor in the pixel circuit. A portion of the first electrode 11 corresponding to the channel region 411a of the active layer ACTa of the driving transistor serves as the control electrode (i.e., the gate) 251a of the driving transistor (referring to FIG. 6).

For example, as shown in FIG. 13, the first conductive layer 10 further includes gate lines Gate. Referring to FIG.

3, the plurality of transistors in the pixel driving circuit 210 include the first transistor M1 and the second transistor M2. Referring to FIGS. 13 to 15, orthographic projections of portions of the active pattern layer 40 on the substrate 101 overlap with an orthographic projection of a gate line Gate in the first conductive layer 10 on the substrate 101, and the portions of the active pattern layer 40 are used as a channel region 411b of an active layer ACTb of the first transistor, and channel regions 411c1 and 411c2 of an active layer ACTc of the second transistor. A second electrode region 422b of the active layer 411b of the first transistor is connected to a first electrode region 421a of the active layer ACTa of the driving transistor, and a second electrode region 422c of the active layer ACTc of the second transistor is connected to a second electrode region 422a of the active layer ACTa of the driving transistor.

For example, a first electrode region 421c of the active layer ACTc of the second transistor is coupled to the first conductive pattern 31. For example, as shown in FIG. 6, the first conductive pattern 31 is in contact with the first electrode region 421c of the active layer ACTc of the second transistor through a via hole 51b provided in a layer (e.g., including the interlayer dielectric layer and the gate insulating layer) interposed therebetween.

For example, a portion of the gate line Gate corresponding to the channel region 411b of the active layer ACTb of the first transistor may serve as a control electrode (i.e., a gate) 251b of the first transistor (referring to FIG. 6). For example, the active layer ACTc of the second transistor includes channel regions 411c1, 411c2 and 411c3. Portions of the gate line Gate corresponding to the channel regions 411c1 and 411c2 of the active layer ACTc of the second transistor may serve as control electrodes (i.e., gates) 251c1 and 251c2 of the second transistor (referring to FIG. 6). That is, the second transistor has a double gate structure, which may avoid a leakage current.

Figure 16:
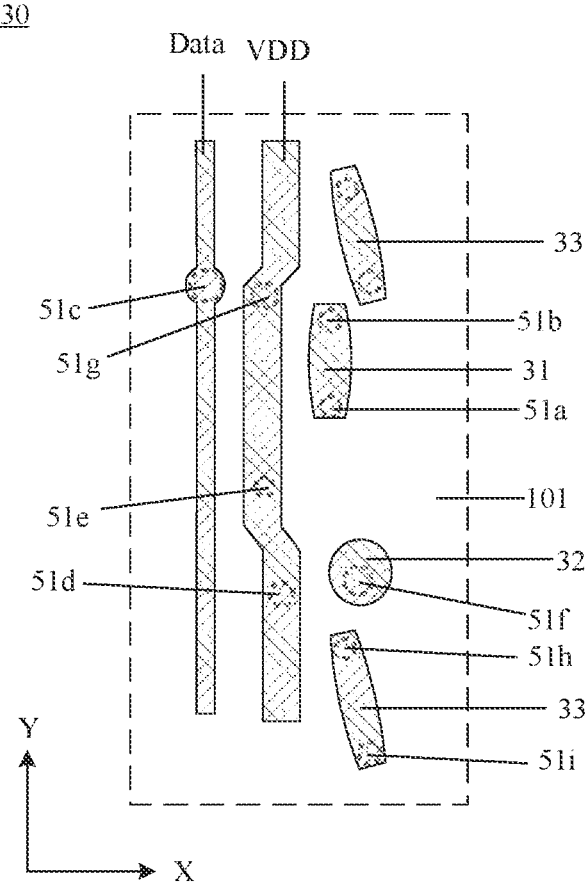
FIG. 16 is a structural diagram of a third conductive layer, in accordance with some embodiments.

In some embodiments, referring to FIG. 16, the third conductive layer 30 further includes data lines Data. A first electrode region of the active layer of the first transistor is coupled to a data line. For example, the data line Data is in contact with the first electrode region 421b of the active layer ACTb of the first transistor through a via hole 51c (referring to FIG. 6) provided in a layer (e.g., including the interlayer dielectric layer and the gate insulating layer) interposed therebetween.

For example, as shown in FIG. 13, the first conductive layer 10 further includes light-emitting control lines EM. The light-emitting control lines EM and the gate lines Gate are arranged at intervals, and the light-emitting control lines EM extend in a same direction as the gate lines Gate. Referring to FIG. 3, the plurality of transistors in the pixel circuit 210 further include the third transistor M3 and the fourth transistor M4. Referring to FIGS. 13 to 15, orthographic projections of portions of the active pattern layer 40 on the substrate 101 overlap with an orthographic projection of the light-emitting control line EM in the first conductive layer 10 on the substrate 101, and the portions of the active pattern layer 40 are used as a channel region 411d of an active layer ACTd of the third transistor and a channel region 411e of an active layer ACTe of the fourth transistor. For example, a portion of the light-emitting control line EM corresponding to the channel region 411d of the active layer of the third transistor may serve as a control electrode 251d of the third transistor (referring to FIG. 6); and a portion of the light-emitting control line EM corresponding to the channel region 411e of the active layer of the fourth transistor may serve as a control electrode 251e of the fourth transistor (referring to FIG. 6). A second electrode region 422d of the active layer ACTd of the third transistor is connected to both the first electrode region 421a of the active layer ACTa of the driving transistor and the second electrode region 422b of the active layer ACTb of the first transistor with no gap therebetween. For example, the active layer ACTd of the third transistor, the active layer ACTa of the driving transistor and the active layer ACTb of the first transistor are connected into an integrated structure. A first electrode region 421e of the active layer ACTe of the fourth transistor is connected to both the second electrode region 422a of the active layer ACTa of the driving transistor and the second electrode region 422c of the active layer ACTc of the second transistor with no gap therebetween. For example, the active layer ACTe of the fourth transistor, the active layer ACTa of the driving transistor, and the active layer ACTc of the second transistor are connected into an integrated structure.

In some embodiments, as shown in FIG. 16, the third conductive layer 30 further includes power supply voltage lines VDD. A first electrode region of the active layer of the third transistor is coupled to a power supply voltage line. For example, the power supply voltage line VDD is in contact with the first electrode region 421d of the active layer of the third transistor through a via hole 51d (referring to FIG. 6) provided in a layer (e.g., including the interlayer dielectric layer and the gate insulating layer) interposed therebetween. Moreover, the second electrode 21 of the first capacitor is coupled to the power supply voltage line VDD. For example, the power supply voltage line VDD is in contact with the second electrode 21 of the first capacitor through a via hole 51e (referring to FIG. 6) provided in a layer (e.g., including the interlayer dielectric layer) interposed therebetween.

For example, as shown in FIGS. 6 and 16, the third conductive layer 30 further includes third conductive patterns 32. A third conductive pattern 32 is coupled to a second electrode region 422e of the active layer of the fourth transistor. For example, the third conductive pattern 32 is in contact with the second electrode region 422e of the active layer of the fourth transistor through a via hole 51f (referring to FIG. 6) provided in a layer (e.g., including the interlayer dielectric layer and the gate insulating layer) interposed therebetween. The third conductive pattern is used to be coupled to the light-emitting device. For example, the third conductive pattern is coupled to an electrode (the anode or the cathode) of the light-emitting device. The fourth transistor is coupled to the light-emitting device. For example, a passivation layer (PVX) is provided on a side of the third conductive layer away from the substrate. For example, the passivation layer is made of an organic material including polyimide. The electrode (the anode or the cathode) of the light-emitting device is in contact with the third conductive pattern 32 through a via hole 61 (referring to FIG. 6) provided in the passivation layer (the light-emitting device is not shown in the figure).

In some embodiments, referring to FIG. 6, a position where the first conductive pattern 31 is coupled to the second sub-electrode 112 (e.g., a position of the via hole 51a) is closer to a position where the first conductive pattern 31 is coupled to the active pattern layer 40 (e.g., a position of the via hole 51b) than a position of the first sub-electrode 111 is. For example, the first conductive pattern is coupled to the portion of the conductor pattern of the active pattern layer, and the portion of the conductor pattern may be the first electrode region 421c of the active layer ACTc of the second transistor. The position where the first conductive pattern 31 is coupled to the second sub-electrode 112 is located outside an orthographic projection of the active layer ACTa of the driving transistor on the substrate 101. In this way, a distance between a position where the first conductive pattern is coupled to the conductor pattern and the position where the first conductive pattern is coupled to the second sub-electrode may be reduced, and a length of the second conductive pattern may be reduced, thereby simplifying the design.

For example, the position where the first conductive pattern 31 is coupled to the second sub-electrode 112 is farther away from the orthographic projection of the third conductive pattern 32 on the substrate 101 than the position of the first sub-electrode 111 is. That is, the orthographic projection the position where the first conductive pattern 31 is coupled to the second sub-electrode 112 on the substrate 101 is farther away from a position where the light-emitting device is coupled to the pixel circuit than the first sub-electrode 111 is. In this way, an orthographic projection of the electrode (the anode or the cathode) of the light-emitting device on the substrate may be prevented from overlapping with the orthographic projection of the first conductive pattern on the substrate, and the influence of parasitic capacitance on the accuracy of the pixel circuit may be avoided.

In some embodiments, as shown in FIG. 16, the third conductive layer 30 includes the power supply voltage lines VDD. For example, the power supply voltage lines VDD each transmit a fixed voltage. For example, the fixed voltage is a direct current voltage, such as a direct current high voltage. The power supply voltage line VDD is coupled to the second electrode 21. In this case, a power supply voltage of the power supply voltage line VDD is transmitted to the second electrode 21, so that a voltage of the second electrode 21 is the power supply voltage.

As shown in FIG. 12, the second conductive layer 20 further includes second conductive pattern(s) 24. As shown in FIG. 6, the second conductive pattern 24 is coupled to the power supply voltage line VDD. For example, the power supply voltage line VDD is in contact with the second conductive pattern 24 through a via hole 51g (referring to FIG. 6) provided in a layer (e.g., including the interlayer dielectric layer) interposed between the third conductive layer 30 and the second conductive layer 20. In this case, a voltage of the second conductive pattern 24 is the power supply voltage. For example, there is at least one position where the power supply voltage line VDD is contact with the second conductive pattern 24. For example, the interlayer dielectric layer ILD is disposed between the third conductive layer 30 and the second conductive layer 20; and the power supply voltage line VDD is in contact with the second electrode 21 through a via hole 51e (referring to FIG. 6) provided in the interlayer dielectric layer. For example, there are at least two positions where the power supply voltage line VDD is in contact with the second conductive pattern 24, and the at least two positions are separated from each other. For example, the power supply voltage line is in contact with the second electrode through at least two via holes that are provided in the interlayer dielectric layer and separated from each other. In this way, it is possible to reduce the resistance of the power supply voltage line through the second conductive pattern, and avoid the loss of the signal transmitted by the power voltage line.

For example, an orthographic projection of the second conductive pattern 24 on the substrate 101 does not overlap with both the orthographic projection of the first electrode 11 on the substrate 101 and the orthographic projection of the second electrode 21 on the substrate 101. For example, the orthographic projection of the second conductive pattern 24 on the substrate 101 does not overlap with the orthographic projection of the gate line Gate on the substrate 101.

In some embodiments, as shown in FIG. 16, the third conductive layer 30 includes the data lines Data. For example, the data lines Data extend in a same direction as the power supply voltage lines VDD. For example, the data lines Data extend in the second direction Y in FIG. 16. For example, the data line Data is configured to transmit a data signal. The pixel circuit drives the light-emitting device to emit light according to the data signal, so as to realize the grayscale display of the sub-pixel. The orthographic projection of the second conductive pattern 24 on the substrate 101 overlaps with an orthographic projection of the data line Data on the substrate 101. For example, the orthographic projection of the second conductive pattern 24 on the substrate 101 overlaps with the orthographic projection of the first electrode region 421b of the first transistor M1 on the substrate 101. In this way, in a case where the data signal transmitted on the data line changes, since the power supply voltage line transmits the fixed voltage, the voltage of the second conductive pattern is kept constant, and the second conductive pattern may play a shielding role to reduce a signal interference of the data signal on the data line to other structures. Thus, it is possible to avoid a problem that a parasitic capacitance created by overlapping portions of the data line and the conductor pattern in the active pattern layer changes, which causes the voltage stability of the pixel circuit to be reduced and affects the light-emitting effect of the light-emitting device.

In some embodiments, in a case where the second conductive layer 20 includes the connection lines 23, an extending direction of the connection lines 23 intersects an extending direction of the power supply voltage lines VDD. For example, the extending direction of the connection lines 23 is perpendicular to the extending direction of the power supply voltage lines VDD. For example, the extending direction of the connection lines 23 is the same as the row direction in which the pixel circuits are arranged (e.g., referring to the first direction X in FIG. 11), and the extending direction of the power supply voltage lines VDD is the same as the column direction in which the pixel circuits are arranged (e.g., referring to the second direction Y in FIG. 11).

It will be understood that, since the connection line 23 is connected to the third electrode 22, and the third electrode 22 is connected to the second electrode 21, so that the connection line 23, the third electrode 22 and the second electrode 21 are connected into an integrated structure. That is, in the extending direction of the connection lines 23, second electrodes of first capacitors are connected into an integrated structure. In this case, in the extending direction of the connection lines 23, voltages of connection lines 23, third electrodes 22 and second electrodes 21 that are connected into an integrated structure are all the power supply voltage. Therefore, the resistances of the power supply voltage lines may be reduced, and the resistance-capacitance (RC) load and current-resistance (IR) drop of the power supply voltage may be reduced.

In addition, in some embodiments, as shown in FIG. 13, the first conductive layer 10 further includes reset signal lines Reset and Reset'. Referring to FIG. 3, the plurality of transistors in the pixel circuit further include the fifth transistor M5 and the sixth transistor M6. Referring to FIGS. 13 to 15, orthographic projections of portions of the active pattern layer 40 on the substrate 101 overlap with an orthographic projection of a reset signal line Reset in the first conductive layer 10 on the substrate 101, and the portions of the active pattern layer 40 are used as channel regions 411/1 and 411/2 of an active layer ACTf of the fifth transistor; and an orthographic projection of a portion of the active pattern layer 40 on the substrate 101 overlaps with an orthographic projection of a reset signal line Reset' in the first conductive layer 10 on the substrate 101, and the portion of the active pattern layer 40 is used as a channel region 411g of an active layer ACTg of the sixth transistor. For example, portions of the reset signal line Reset corresponding to the channel regions 411/1 and 411/2 of the active layer of the fifth transistor may serve as control electrodes 251/1 and 251/2 of the fifth transistor (referring to FIG. 6). That is, the fifth transistor has a double gate structure, which may avoid the generation of leakage current. A portion of the reset signal line Reset' corresponding to the channel region 411g of the active layer of the sixth transistor may serve as a control electrode 251g of the sixth transistor (referring to FIG. 6). A second electrode region 422f of the active layer ACTf of the fifth transistor is connected to the first electrode region 421c of the active layer ACTc of the second transistor. For example, the second electrode region 422f of the active layer ACTf of the fifth transistor is coupled to the first conductive pattern 31, and thus coupled to the second sub-electrode 112 and the first sub-electrode 111. That is, the second electrode region 422f of the active layer ACTf of the fifth transistor is coupled to the control electrode 251a of the driving transistor. A second electrode region 422g of the active layer ACTg of the sixth transistor is connected to the second electrode region 422e of the active layer ACTe of the fourth transistor. For example, the second electrode region 422g of the active layer ACTg of the sixth transistor is coupled to the third conductive pattern 32. For example, the second electrode region 422g of the active layer ACTg of the sixth transistor is coupled to the light-emitting device.

For example, as shown in FIG. 12, the second conductive layer 20 further includes initial signal lines Init. For example, an extending direction of the initial signal lines Init is the same as an extending direction of the reset signal lines Reset and Reset'. As shown in FIG. 16, the third pattern layer 30 further includes fourth conductive patterns 33. The fourth conductive pattern 33 is coupled to the initial signal line Init, and the fourth conductive pattern 33 is further coupled to a first electrode region 421g of the active layer of the sixth transistor. For example, referring to FIG. 6, the fourth conductive pattern 33 is in contact with the initial signal line Init through a via hole 51h provided in a layer (e.g., including the interlayer dielectric layer) interposed therebetween, and the fourth conductive pattern 33 is in contact with the first electrode region 421g of the active layer of the sixth transistor through a via hole 51i provided in a layer (e.g., including the interlayer dielectric layer and the gate insulating layer) interposed therebetween.

For example, the reset signal lines Reset and Reset' may transmit a same signal. For example, a single row of pixel circuits may be coupled to a single reset signal line. Thus, the fifth transistor and the sixth transistor in a same row are turned on simultaneously, so as to reset the driving transistor and the light-emitting device in a same time period.

For another example, the reset signal lines Reset and Reset' may transmit different signals. For example, a single row of pixel circuits may be coupled to two reset signal lines Reset and Reset'. For example, a reset signal line Reset coupled to fifth transistors in a row of pixel circuits transmits a same signal as a gate line coupled to a previous row of pixel circuits previous to the row of pixel circuits; and another reset signal line Reset' coupled to six transistors in the row of pixel circuits transmits a same signal as a gate line coupled to the row of pixel circuits. In this case, the reset signal line coupled to the row of pixel circuits is also used as the gate line coupled to the previous row of pixel circuits, and the another reset signal line coupled to the row of pixel circuits may also be used as the gate line coupled to the row of pixel circuits.

In this case, in response to a reset signal from the reset signal line coupled to a fifth transistor in each pixel circuit in the row of pixel circuits, the fifth transistor is turned on and transmit an initial signal from the initial signal line to a control electrode of a driving transistor in the pixel circuit in the row of pixel circuits, so as to reset the driving transistor. At the same time, a first transistor and a second transistor in each pixel circuit in the previous row of pixel circuits are turned on in response to a gate driving signal from the gate line coupled to the first transistor and the second transistor in the previous row of pixel circuits, a data signal is written, and a threshold voltage of a driving transistor in the pixel circuit in the previous row of pixel circuits and the data signal are written into the control electrode of the driving transistor. In response to a reset signal from the another reset signal line coupled to a sixth transistor in the pixel circuit in the row of pixel circuits, the sixth transistor is turned on to reset the light-emitting device. At the same time, a first transistor and a second transistor in the pixel circuit in the row of pixel circuits are turned on in response to a gate driving signal from the gate line coupled to the first transistor and the second transistor in the row of pixel circuits, a data signal is written, and a threshold voltage of the driving transistor in the pixel circuit in the row of pixel circuits and the data signal are written into the control electrode of the driving transistor.

For example, the material of the active layer of each transistor in the active pattern layer includes amorphous silicon, polycrystalline silicon or an organic semiconductor material. All structures in the first conductive layer (e.g., including the first electrodes, the gate lines, the light-emitting control lines, and the reset signal lines), all structures in the second conductive layer (e.g., including the second electrodes, and the initial signal lines), and all structures in the third conductive layer (e.g., including the data lines, and the power supply voltage lines) may each be a single-layer structure or a multi-stacked layer structure, and the material of the single-layer structure and multi-stacked layer structure includes at least one of aluminum (Al), silver (Ag), magnesium (Mg), molybdenum (Mo), titanium (Ti), copper (Cu) and other metals.

Some embodiments of the present disclosure provide a method for manufacturing a driving backplane. The driving backplane is the driving backplane 100 (e.g., as shown in FIG. 6) in any one of the above embodiments.

Referring to FIGS. 6 and 7, the method includes: forming a first conductive layer 10 on a substrate 101; forming an insulating layer 102 on a side of the first conductive layer 10 away from the substrate 101; and forming a second conductive layer 20 on a side of the insulating layer 102 away from the substrate 101.

The first conductive layer includes first electrode(s), the second conductive layer includes second electrode(s), and the first electrode(s) each include a first sub-electrode and a second sub-electrode. An orthographic projection of the first sub-electrode on the substrate coincides with an orthographic projection of the second sub-electrode on the substrate; the second sub-electrode surrounds the first sub-electrode; and the first sub-electrode and the second electrode, and a portion of the insulating layer located therebetween constitute a first capacitor.

It will be noted that, the method for manufacturing the driving backplane has the same beneficial effects as the driving backplane described in the above embodiments, and details will not be repeated here.

Figure 17:
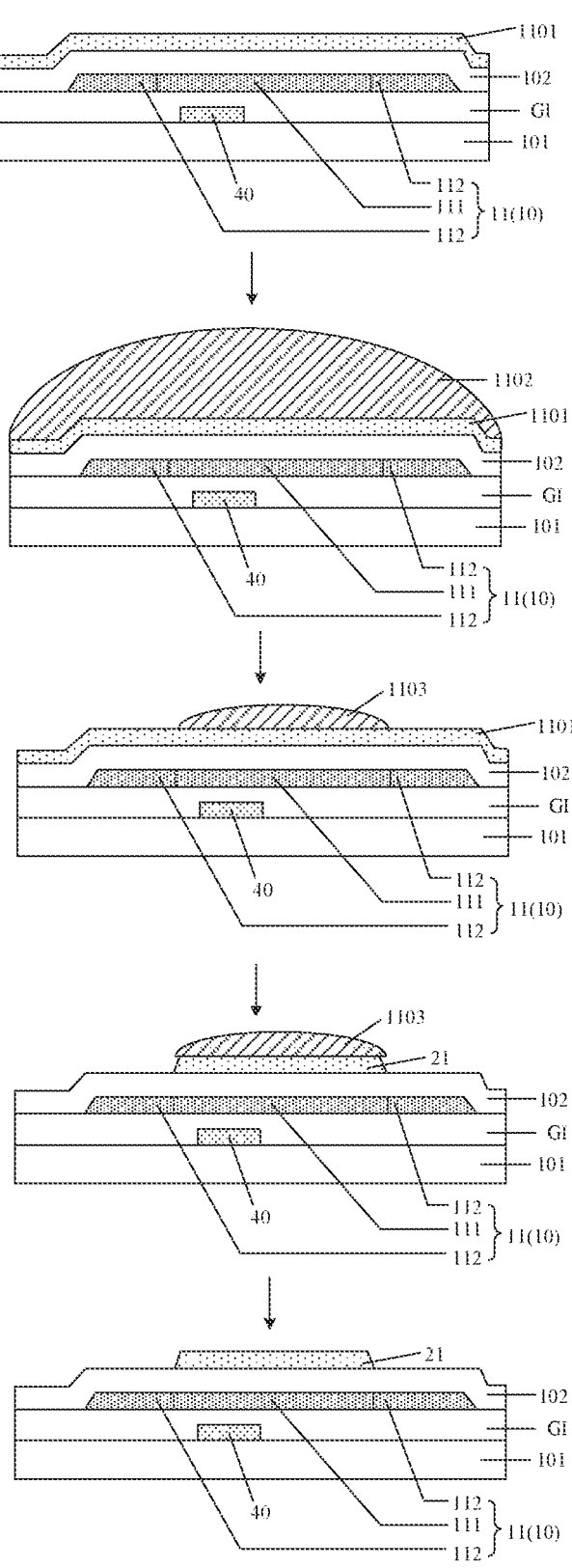
FIG. 17 is a diagram illustrating a process of manufacturing a driving backplane, in accordance with some embodiments.

In some embodiments, referring to FIG. 17, forming the second electrode(s) 21 includes: forming a conductive film 1101 on the side of the first conductive layer 10 away from the substrate 101; forming a photoresist layer 1102 on the conductive film 1101; exposing and developing the photoresist layer 1102 through a mask, so as to obtain a patterned photoresist layer 1103, the patterned photoresist layer 1103 covering a portion of the conductive film 1101 located in a region where the at least one first sub-electrode 111 is located; removing the patterned photoresist layer 1103 and a portion of the conductive film 1101 located outside an orthographic projection of the patterned photoresist layer 1103 on the substrate 101 through an etching process, so as to obtain the second electrode(s) 21 with no opening. For example, the etching process may be a dry etching process.

Figure 18:
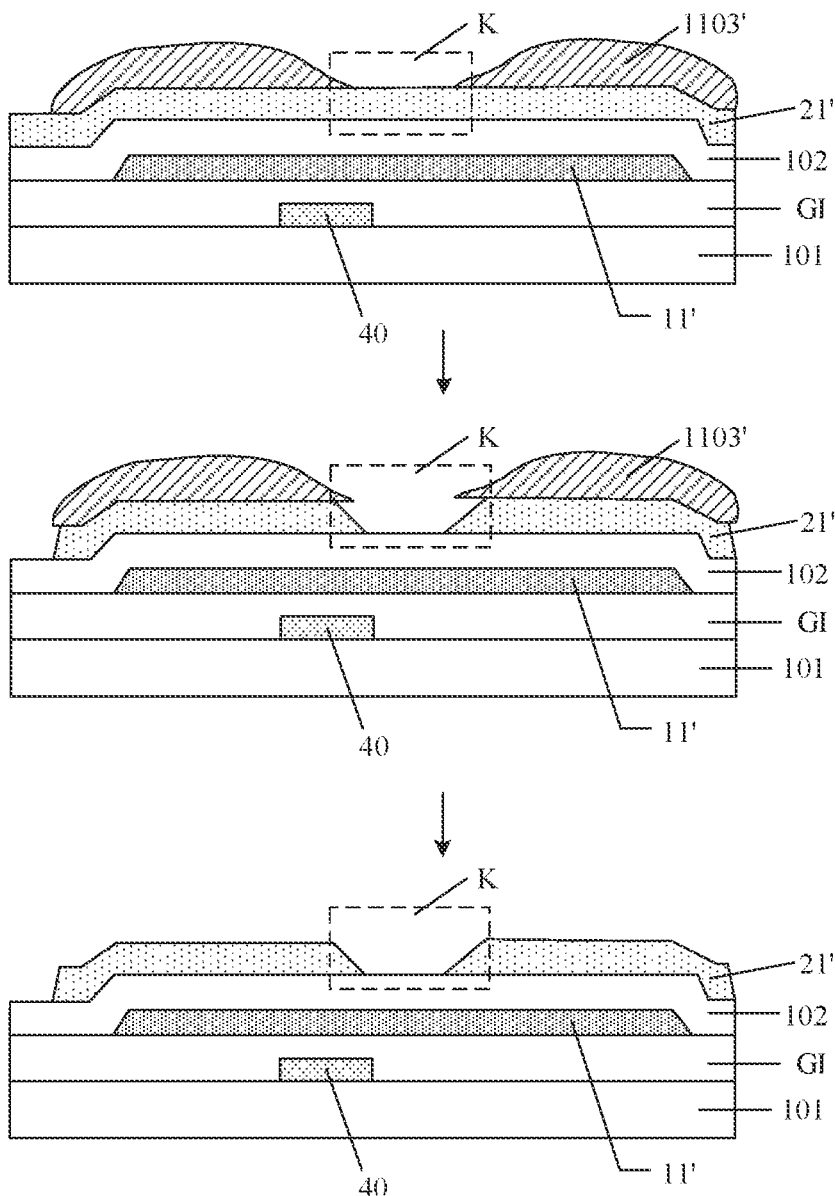
FIG. 18 is a diagram illustrating a process of manufacturing a driving backplane, in accordance with some other embodiments.

In this case, for the second electrode 21' of the first capacitor C1' (referring to FIG. 5), the second electrode 21' has the opening K; and referring to FIG. 18, after exposure and development, a surface of a patterned photoresist layer 1103' at a position where the opening K is to be formed is not flat. For example, the surface of a patterned photoresist layer 1103' has a step or a slope proximate to a position where the opening K is to be formed. A thickness of a portion of the patterned photoresist layer 1103' proximate to the opening K is less than a thickness of a portion of the patterned photoresist layer 1103' away from the opening K, and a thickness of the photoresist layer is non-uniform. Therefore, during the etching process, a portion of the conductive film proximate to the opening K is prone to be over etched, which results in a deviation in a size of the opening K. That is, a CD of the opening K fluctuates. As a result, the overlapping area of the second electrode and the first electrode changes, which causes a change in the capacitance of the first capacitor. In light of this, for the second electrode 21 of the first capacitor C1 (referring to FIG. 8), the second electrode 21 has no opening; and after exposure and development, referring to FIG. 17, a surface of the patterned photoresist layer 1103 is flat, e.g., with no step or slope. A distance between an edge of the second electrode 21 and an edge of the first electrode 11 is large. A thickness of the patterned photoresist layer on the conductive film is uniform, and the patterned photoresist layer is relatively flat. Thus, it may be possible to avoid a problem that the conductive film is over etched, and avoid the change of the overlapping area of the second electrode and the first electrode. That is, the change of an overlapping area of the second electrode and the first sub-electrode is avoided, thereby improving the accuracy of the first capacitor.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A driving backplane, comprising:
a substrate;
a first conductive layer disposed on the substrate, wherein the first conductive layer includes a first electrode, the first electrode includes a first sub-electrode and a second sub-electrode surrounding the first sub-electrode, and the second sub-electrode and the first sub-electrode have no gap therebetween;
an insulating layer disposed on a side of the first conductive layer away from the substrate; and
a second conductive layer disposed on a side of the insulating layer away from the substrate, wherein the second conductive layer includes a second electrode; an orthographic projection of the second electrode on the substrate coincides with an orthographic projection of the first sub-electrode on the substrate; and the first sub-electrode, the second electrode and a portion of the insulating layer located therebetween constitute a first capacitor; and
the second conductive layer further includes third electrodes located on two opposite sides of the second electrode; the third electrodes are connected to the second electrode, orthographic projections of the third electrodes on the substrate are within an orthographic projection of the second sub-electrode on the substrate, and an edge of a third electrode of the third electrodes away from the second electrode is flush with a portion of an edge of the second sub-electrode; and the third electrode, a portion of the second sub-electrode that overlaps with the third electrode and a portion of the insulating layer located therebetween constitute a second capacitor.

2. The driving backplane according to claim 1, wherein the first capacitor is included in a pixel circuit in the driving backplane.

3. The driving backplane according to claim 1, wherein the second electrode has no opening.

4. The driving backplane according to claim 1, wherein a distance between an edge of the orthographic projection of the second electrode on the substrate and an edge of an orthographic projection of the first electrode on the substrate is greater than or equal to 1 μm.

5. The driving backplane according to claim 1, wherein a width of the third electrode is less than a width of the second electrode.

6. The driving backplane according to claim 5, wherein widths of the third electrodes located on the two opposite sides of the second electrode are equal.

7. The driving backplane according to claim 5, wherein the number of second electrodes is multiple;
the second conductive layer further includes a connection line; an orthographic projection of the connection line on the substrate does not overlap with the orthographic projection of the second sub-electrode on the substrate; the connection line is connected to two adjacent third electrodes, and the two adjacent third electrodes are connected to two adjacent second electrodes of the second electrodes, respectively; and
a width of the connection line is equal to the width of the third electrode.

8. The driving backplane according to claim 1, further comprising:
a third conductive layer disposed on a side of the second conductive layer away from the substrate, wherein the third conductive layer includes a first conductive pattern; and
the first conductive pattern is coupled to the second sub-electrode.

9. The driving backplane according to claim 8, wherein an orthographic projection of the first conductive pattern on the substrate does not overlap with the orthographic projection of the second electrode on the substrate.

10. The driving backplane according to claim 8, further comprising:

an active pattern layer disposed on the substrate and located on a side of the substrate proximate to the first conductive layer, wherein the active pattern layer includes a semiconductor pattern and a conductor pattern; and the first conductive pattern is further coupled to a portion of the conductor pattern of the active pattern layer.

11. The driving backplane according to claim 10, wherein a position where the first conductive pattern is coupled to the second sub-electrode is closer to a position where the first conductive pattern is coupled to the active pattern layer than a position of the first sub-electrode is.

12. The driving backplane according to claim 8, wherein the third conductive layer further includes power supply voltage lines; a power supply voltage line of the power supply voltage lines is coupled to the second electrode;

the second conductive layer further includes a second conductive pattern; and the second conductive pattern is coupled to the power supply voltage line.

13. The driving backplane according to claim 12, wherein the third conductive layer further includes data lines;

an orthographic projection of the second conductive pattern on the substrate overlaps with an orthographic projection of a data line of the data lines on the substrate.

14. The driving backplane according to claim 12, wherein the number of second electrodes is multiple; the second conductive layer further includes a connection line, the connection line is connected to two adjacent third electrodes, and the two adjacent third electrodes are connected to two adjacent second electrodes of the second electrodes, respectively; and an extending direction of the connection line intersects an extending direction of the power supply voltage lines.

15. A display panel, comprising the driving backplane according to claim 1.

16. A display apparatus, comprising the display panel according to claim 15.

17. A method for manufacturing a driving backplane, comprising:

forming a first conductive layer on a substrate, the first conductive layer including a first electrode;

forming an insulating layer on a side of the driving backplane away from the substrate; and forming a second conductive layer on a side of the insulating layer away from the substrate, wherein the second conductive layer includes a second electrode; the first electrode includes a first sub-electrode and a second sub-electrode; an orthographic projection of the first sub-electrode on the substrate coincides with an orthographic projection of the second electrode on the substrate; and the second sub-electrode surrounds the first sub-electrode; the first sub-electrode, the second electrode and a portion of the insulating layer located therebetween constitute a first capacitor; and the second conductive layer further includes third electrodes located on two opposite sides of the second electrode; the third electrodes are connected to the second electrode, orthographic projections of the third electrodes on the substrate are within an orthographic projection of the second sub-electrode on the substrate, and an edge of a third electrode of the third electrodes away from the second electrode is flush with a portion of an edge of the second sub-electrode; and the third electrode, a portion of the second sub-electrode that overlaps with the third electrode and a portion of the insulating layer located therebetween constitute a second capacitor.

18. The method according to claim 17, wherein forming the second electrode, includes:

forming a conductive film on the side of the first conductive layer away from the substrate;

forming a photoresist layer on the conductive film;

exposing and developing the photoresist layer through a mask, so as to obtain a patterned photoresist layer, the patterned photoresist layer covering a portion of the conductive film located in a region where the first sub-electrode is located; and removing the patterned photoresist layer and a portion of the conductive film that is located outside an orthographic projection of the patterned photoresist layer on the substrate through an etching process, so as to obtain the second electrode with no opening.

* * * * *